(12) United States Patent
Furtek et al.

(10) Patent No.: US 7,979,646 B2
(45) Date of Patent: *Jul. 12, 2011

(54) EXTERNAL MEMORY CONTROLLER NODE

(75) Inventors: Fredrick Curtis Furtek, Menlo Park, CA (US); Paul L. Master, Sunnyvale, CA (US)

(73) Assignee: QST Holdings, Inc., Palo Alto, CA (US)

( * ) Notice: Subject to any disclaimer, the term of this patent is extended or adjusted under 35 U.S.C. 154(b) by 91 days.

This patent is subject to a terminal disclaimer.

(21) Appl. No.: 12/251,905

(22) Filed: Oct. 15, 2008

(65) Prior Publication Data

US 2009/0037673 A1     Feb. 5, 2009

Related U.S. Application Data

(63) Continuation of application No. 12/115,843, filed on May 6, 2008, which is a continuation of application No. 11/803,998, filed on May 16, 2007, now Pat. No. 7,451,280, which is a continuation of application No. 10/719,921, filed on Nov. 20, 2003, now Pat. No. 7,225,301.

(60) Provisional application No. 60/428,646, filed on Nov. 22, 2002.

(51) Int. Cl.
*G06F 12/00*     (2006.01)
*G06F 13/00*     (2006.01)

(52) U.S. Cl. ........................................ 711/149; 711/154
(58) Field of Classification Search .................. None
See application file for complete search history.

(56) References Cited

U.S. PATENT DOCUMENTS

| | | | |
|---|---|---|---|
| 4,302,775 A | 11/1981 | Widergren et al. |
| 4,380,046 A | 4/1983 | Fung et al. |
| 4,578,799 A | 3/1986 | Scholl et al. |
| 4,633,386 A | 12/1986 | Terepin et al. |
| 4,649,512 A | 3/1987 | Nukiyama |
| 4,694,416 A | 9/1987 | Wheeler et al. |
| 4,713,755 A | 12/1987 | Worley, Jr. et al. |
| 4,748,585 A | 5/1988 | Chiarulli et al. |
| 4,758,985 A | 7/1988 | Carter |
| 4,760,525 A | 7/1988 | Webb |
| 4,760,544 A | 7/1988 | Lamb |
| 4,811,214 A | 3/1989 | Nosenchuck et al. |
| 4,870,302 A | 9/1989 | Freeman |
| 4,905,231 A | 2/1990 | Leung et al. |
| 4,967,340 A | 10/1990 | Dawes |

(Continued)

FOREIGN PATENT DOCUMENTS

DE     100 18 374 A1     10/2001

(Continued)

OTHER PUBLICATIONS

U.S. Appl. No. 10/719,921 Office Action Date Mailed Jun. 14, 2006.

(Continued)

*Primary Examiner* — Kevin Verbrugge
(74) *Attorney, Agent, or Firm* — Nixon Peabody LLP

(57) ABSTRACT

A memory controller to provide memory access services in an adaptive computing engine is provided. The controller comprises: a network interface configured to receive a memory request from a programmable network; and a memory interface configured to access a memory to fulfill the memory request from the programmable network, wherein the memory interface receives and provides data for the memory request to the network interface, the network interface configured to send data to and receive data from the programmable network.

43 Claims, 5 Drawing Sheets

U.S. PATENT DOCUMENTS

| | | |
|---|---|---|
| 5,021,947 A | 6/1991 | Campbell et al. |
| 5,090,015 A | 2/1992 | Dabbish et al. |
| 5,099,418 A | 3/1992 | Pian et al. |
| 5,144,166 A | 9/1992 | Camarota et al. |
| 5,165,023 A | 11/1992 | Gifford |
| 5,193,151 A | 3/1993 | Jain |
| 5,202,993 A | 4/1993 | Tarsy et al. |
| 5,218,240 A | 6/1993 | Camarota et al. |
| 5,245,227 A | 9/1993 | Furtek et al. |
| 5,261,099 A | 11/1993 | Bigo et al. |
| 5,301,100 A | 4/1994 | Wagner |
| 5,335,276 A | 8/1994 | Thompson et al. |
| 5,336,950 A | 8/1994 | Popli et al. |
| 5,339,428 A | 8/1994 | Burmeister et al. |
| 5,361,362 A | 11/1994 | Benkeser et al. |
| 5,379,343 A | 1/1995 | Grube et al. |
| 5,381,546 A | 1/1995 | Servi et al. |
| 5,381,550 A | 1/1995 | Jourdenais et al. |
| 5,388,062 A | 2/1995 | Knutson |
| 5,388,212 A | 2/1995 | Grube et al. |
| 5,428,754 A | 6/1995 | Baldwin |
| 5,450,557 A | 9/1995 | Kopp et al. |
| 5,465,368 A | 11/1995 | Davidson et al. |
| 5,475,856 A | 12/1995 | Kogge |
| 5,479,055 A | 12/1995 | Eccles |
| 5,490,165 A | 2/1996 | Blakeney, II et al. |
| 5,491,823 A | 2/1996 | Ruttenberg |
| 5,507,009 A | 4/1996 | Grube et al. |
| 5,515,519 A | 5/1996 | Yoshioka et al. |
| 5,517,600 A | 5/1996 | Shimokawa |
| 5,519,694 A | 5/1996 | Brewer et al. |
| 5,522,070 A | 5/1996 | Sumimoto |
| 5,530,964 A | 6/1996 | Alpert et al. |
| 5,534,796 A | 7/1996 | Edwards |
| 5,555,417 A | 9/1996 | Odnert et al. |
| 5,560,028 A | 9/1996 | Sachs et al. |
| 5,560,038 A | 9/1996 | Haddock |
| 5,572,572 A | 11/1996 | Kawan et al. |
| 5,590,353 A | 12/1996 | Sakakibara et al. |
| 5,594,657 A | 1/1997 | Cantone et al. |
| 5,600,810 A | 2/1997 | Ohkami |
| 5,600,844 A | 2/1997 | Shaw et al. |
| 5,602,833 A | 2/1997 | Zehavi |
| 5,603,043 A | 2/1997 | Taylor et al. |
| 5,623,545 A | 4/1997 | Childs et al. |
| 5,625,669 A | 4/1997 | McGregor et al. |
| 5,630,206 A | 5/1997 | Urban et al. |
| 5,635,940 A | 6/1997 | Hickman et al. |
| 5,646,544 A | 7/1997 | Iadanza |
| 5,646,545 A | 7/1997 | Trimberger et al. |
| 5,684,793 A | 11/1997 | Kiema et al. |
| 5,684,980 A | 11/1997 | Casselman |
| 5,694,613 A | 12/1997 | Suzuki |
| 5,701,398 A | 12/1997 | Glier et al. |
| 5,701,482 A | 12/1997 | Harrison et al. |
| 5,704,053 A | 12/1997 | Santhanam |
| 5,706,191 A | 1/1998 | Bassett et al. |
| 5,712,996 A | 1/1998 | Schepers |
| 5,720,002 A | 2/1998 | Wang |
| 5,721,693 A | 2/1998 | Song |
| 5,721,854 A | 2/1998 | Ebicioglu et al. |
| 5,729,754 A | 3/1998 | Estes |
| 5,734,808 A | 3/1998 | Takeda |
| 5,737,631 A | 4/1998 | Trimberger |
| 5,742,180 A | 4/1998 | DeHon et al. |
| 5,742,821 A | 4/1998 | Prasanna |
| 5,751,295 A | 5/1998 | Becklund et al. |
| 5,754,227 A | 5/1998 | Fukuoka |
| 5,758,261 A | 5/1998 | Weideman |
| 5,768,561 A | 6/1998 | Wise |
| 5,771,362 A | 6/1998 | Bartkowiak et al. |
| 5,778,439 A | 7/1998 | Trimberger et al. |
| 5,784,636 A | 7/1998 | Rupp |
| 5,784,699 A | 7/1998 | McMahon et al. |
| 5,787,237 A | 7/1998 | Reilly |
| 5,790,817 A | 8/1998 | Asghar et al. |
| 5,794,062 A | 8/1998 | Baxter |
| 5,794,067 A | 8/1998 | Kadowaki |
| 5,802,055 A | 9/1998 | Krein et al. |
| 5,802,278 A | 9/1998 | Isfeld et al. |
| 5,818,603 A | 10/1998 | Motoyama |
| 5,822,308 A | 10/1998 | Weigand et al. |
| 5,822,313 A | 10/1998 | Malek et al. |
| 5,822,360 A | 10/1998 | Lee et al. |
| 5,828,858 A | 10/1998 | Athanas et al. |
| 5,835,753 A | 11/1998 | Witt |
| 5,838,165 A | 11/1998 | Chatter |
| 5,838,894 A | 11/1998 | Horst |
| 5,860,021 A | 1/1999 | Klingman |
| 5,870,427 A | 2/1999 | Teidemann, Jr. et al. |
| 5,873,045 A | 2/1999 | Lee et al. |
| 5,881,106 A | 3/1999 | Cartier |
| 5,884,284 A | 3/1999 | Peters et al. |
| 5,886,537 A | 3/1999 | Macias et al. |
| 5,887,174 A | 3/1999 | Simons et al. |
| 5,889,816 A | 3/1999 | Agrawal et al. |
| 5,890,014 A | 3/1999 | Long |
| 5,892,900 A | 4/1999 | Ginter et al. |
| 5,892,961 A | 4/1999 | Trimberger |
| 5,892,962 A | 4/1999 | Cloutier |
| 5,894,473 A | 4/1999 | Dent |
| 5,903,886 A | 5/1999 | Heimlich et al. |
| 5,907,580 A | 5/1999 | Cummings |
| 5,910,733 A | 6/1999 | Bertolet et al. |
| 5,912,572 A | 6/1999 | Graf, III |
| 5,913,172 A | 6/1999 | McCabe et al. |
| 5,917,852 A | 6/1999 | Butterfield et al. |
| 5,920,801 A | 7/1999 | Thomas et al. |
| 5,931,918 A | 8/1999 | Row et al. |
| 5,933,642 A | 8/1999 | Greenbaum et al. |
| 5,940,438 A | 8/1999 | Poon et al. |
| 5,949,415 A | 9/1999 | Lin et al. |
| 5,950,011 A | 9/1999 | Albrecht et al. |
| 5,950,131 A | 9/1999 | Vilmur |
| 5,951,674 A | 9/1999 | Moreno |
| 5,953,322 A | 9/1999 | Kimball |
| 5,956,518 A | 9/1999 | DeHon et al. |
| 5,959,881 A | 9/1999 | Trimberger et al. |
| 5,963,048 A | 10/1999 | Harrison et al. |
| 5,966,534 A | 10/1999 | Cooke et al. |
| 5,970,254 A | 10/1999 | Cooke et al. |
| 5,987,611 A | 11/1999 | Freund |
| 5,991,302 A | 11/1999 | Berl et al. |
| 5,991,308 A | 11/1999 | Fuhrmann et al. |
| 5,999,734 A | 12/1999 | Willis et al. |
| 6,005,943 A | 12/1999 | Cohen et al. |
| 6,006,249 A | 12/1999 | Leong |
| 6,016,395 A | 1/2000 | Mohamed |
| 6,018,783 A | 1/2000 | Chiang |
| 6,021,186 A | 2/2000 | Suzuki et al. |
| 6,021,492 A | 2/2000 | May |
| 6,023,742 A | 2/2000 | Ebeling et al. |
| 6,023,755 A | 2/2000 | Casselman |
| 6,028,610 A | 2/2000 | Deering |
| 6,041,322 A | 3/2000 | Meng et al. |
| 6,046,603 A | 4/2000 | New |
| 6,047,115 A | 4/2000 | Mohan et al. |
| 6,052,600 A | 4/2000 | Fette et al. |
| 6,055,314 A | 4/2000 | Spies et al. |
| 6,056,194 A | 5/2000 | Kolls |
| 6,059,840 A | 5/2000 | Click, Jr. |
| 6,061,580 A | 5/2000 | Altschul et al. |
| 6,073,132 A | 6/2000 | Gehman |
| 6,076,174 A | 6/2000 | Freund |
| 6,078,736 A | 6/2000 | Guccione |
| 6,088,043 A | 7/2000 | Kelleher et al. |
| 6,091,263 A | 7/2000 | New et al. |
| 6,091,765 A | 7/2000 | Pietzold, III et al. |
| 6,094,065 A | 7/2000 | Tavana et al. |
| 6,094,726 A | 7/2000 | Gonion et al. |
| 6,111,893 A | 8/2000 | Volftsun et al. |
| 6,111,935 A | 8/2000 | Hughes-Hartogs |
| 6,115,751 A | 9/2000 | Tam et al. |
| 6,119,178 A | 9/2000 | Martin et al. |
| 6,120,551 A | 9/2000 | Law et al. |
| 6,122,670 A | 9/2000 | Bennett et al. |
| 6,128,307 A | 10/2000 | Brown |

| | | | | | | |
|---|---|---|---|---|---|---|
| 6,134,605 | A | 10/2000 | Hudson et al. | 6,556,044 B2 | 4/2003 | Langhammer et al. |
| 6,134,629 | A | 10/2000 | L'Ecuyer | 6,563,891 B1 | 5/2003 | Eriksson et al. |
| 6,141,283 | A | 10/2000 | Bogin et al. | 6,570,877 B1 | 5/2003 | Kloth et al. |
| 6,150,838 | A | 11/2000 | Wittig et al. | 6,577,678 B2 | 6/2003 | Scheuermann |
| 6,154,492 | A | 11/2000 | Araki et al. | 6,587,684 B1 | 7/2003 | Hsu et al. |
| 6,154,494 | A | 11/2000 | Sugahara et al. | 6,590,415 B2 | 7/2003 | Agrawal et al. |
| 6,157,997 | A | 12/2000 | Oowaki et al. | 6,601,086 B1 | 7/2003 | Howard et al. |
| 6,173,389 | B1 | 1/2001 | Pechanek et al. | 6,601,158 B1 | 7/2003 | Abbott et al. |
| 6,175,854 | B1 | 1/2001 | Bretscher | 6,604,085 B1 | 8/2003 | Kolls |
| 6,175,892 | B1 | 1/2001 | Sazzad et al. | 6,604,189 B1 | 8/2003 | Zemlyak et al. |
| 6,185,418 | B1 | 2/2001 | MacLellan et al. | 6,606,529 B1 | 8/2003 | Crowder, Jr. et al. |
| 6,192,070 | B1 | 2/2001 | Poon et al. | 6,611,908 B2 | 8/2003 | Lentz et al. |
| 6,192,255 | B1 | 2/2001 | Lewis et al. | 6,615,333 B1 | 9/2003 | Hoogerbrugge et al. |
| 6,192,388 | B1 | 2/2001 | Cajolet | 6,618,434 B2 | 9/2003 | Heidari-Bateni et al. |
| 6,195,788 | B1 | 2/2001 | Leaver et al. | 6,618,777 B1 | 9/2003 | Greenfield |
| 6,198,924 | B1 | 3/2001 | Ishii et al. | 6,640,304 B2 | 10/2003 | Ginter et al. |
| 6,199,181 | B1 | 3/2001 | Rechef et al. | 6,647,429 B1 | 11/2003 | Semal |
| 6,202,130 | B1 | 3/2001 | Scales, III et al. | 6,653,859 B2 | 11/2003 | Sihlbom et al. |
| 6,202,189 | B1 | 3/2001 | Hinedi et al. | 6,675,265 B2 | 1/2004 | Barroso et al. |
| 6,219,697 | B1 | 4/2001 | Lawande et al. | 6,675,284 B1 | 1/2004 | Warren |
| 6,219,756 | B1 | 4/2001 | Kasamizugami | 6,684,319 B1 | 1/2004 | Mohamed et al. |
| 6,219,780 | B1 | 4/2001 | Lipasti | 6,691,148 B1 | 2/2004 | Zinky et al. |
| 6,223,222 | B1 | 4/2001 | Fijolek et al. | 6,694,380 B1 | 2/2004 | Wolrich et al. |
| 6,226,387 | B1 | 5/2001 | Tewfik et al. | 6,711,617 B1 | 3/2004 | Bantz et al. |
| 6,230,307 | B1 | 5/2001 | Davis et al. | 6,718,182 B1 | 4/2004 | Kung |
| 6,237,029 | B1 | 5/2001 | Master et al. | 6,721,286 B1 | 4/2004 | Williams et al. |
| 6,246,883 | B1 | 6/2001 | Lee | 6,721,884 B1 | 4/2004 | De Oliveira Kastrup Pereira et al. |
| 6,247,125 | B1 | 6/2001 | Noel-Baron et al. | 6,732,354 B2 | 5/2004 | Ebeling et al. |
| 6,249,251 | B1 | 6/2001 | Chang et al. | 6,735,621 B1 | 5/2004 | Yoakum et al. |
| 6,263,057 | B1 | 7/2001 | Silverman | 6,738,744 B2 | 5/2004 | Kirovski et al. |
| 6,266,760 | B1 | 7/2001 | DeHon et al. | 6,751,723 B1 | 6/2004 | Kundu et al. |
| 6,272,579 | B1 | 8/2001 | Lentz et al. | 6,754,470 B2 | 6/2004 | Hendrickson et al. |
| 6,272,616 | B1 | 8/2001 | Fernando et al. | 6,760,587 B2 | 7/2004 | Holtzman et al. |
| 6,281,703 | B1 | 8/2001 | Furuta et al. | 6,760,833 B1 | 7/2004 | Dowling |
| 6,282,627 | B1 | 8/2001 | Wong et al. | 6,766,165 B2 | 7/2004 | Sharma et al. |
| 6,289,375 | B1 | 9/2001 | Knight et al. | 6,778,212 B1 | 8/2004 | Deng et al. |
| 6,289,434 | B1 | 9/2001 | Roy | 6,785,341 B2 | 8/2004 | Walton et al. |
| 6,289,488 | B1 | 9/2001 | Dave et al. | 6,807,590 B1 | 10/2004 | Carlson et al. |
| 6,292,822 | B1 | 9/2001 | Hardwick | 6,819,140 B2 | 11/2004 | Yamanaka et al. |
| 6,292,827 | B1 | 9/2001 | Raz | 6,823,448 B2 | 11/2004 | Roth et al. |
| 6,301,653 | B1 | 10/2001 | Mohamed et al. | 6,829,633 B2 | 12/2004 | Gelfer et al. |
| 6,305,014 | B1 | 10/2001 | Roediger et al. | 6,832,250 B1 | 12/2004 | Coons et al. |
| 6,311,149 | B1 | 10/2001 | Ryan et al. | 6,836,839 B2 | 12/2004 | Master et al. |
| 6,326,806 | B1 | 12/2001 | Fallside et al. | 6,859,434 B2 | 2/2005 | Segal et al. |
| 6,346,824 | B1 | 2/2002 | New | 6,865,664 B2 | 3/2005 | Budrovic et al. |
| 6,347,346 | B1 | 2/2002 | Taylor | 6,871,236 B2 | 3/2005 | Fishman et al. |
| 6,349,394 | B1 | 2/2002 | Brock et al. | 6,883,074 B2 | 4/2005 | Lee et al. |
| 6,353,841 | B1 | 3/2002 | Marshall et al. | 6,883,084 B1 | 4/2005 | Donohoe |
| 6,356,994 | B1 | 3/2002 | Barry et al. | 6,894,996 B2 | 5/2005 | Lee |
| 6,359,248 | B1 | 3/2002 | Mardi | 6,901,440 B1 | 5/2005 | Bimm et al. |
| 6,360,256 | B1 | 3/2002 | Lim | 6,907,598 B2 | 6/2005 | Fraser |
| 6,360,259 | B1 | 3/2002 | Bradley | 6,912,515 B2 | 6/2005 | Jackson et al. |
| 6,360,263 | B1 | 3/2002 | Kurtzberg et al. | 6,941,336 B1 | 9/2005 | Mar |
| 6,366,999 | B1 | 4/2002 | Drabenstott et al. | 6,980,515 B1 | 12/2005 | Schunk et al. |
| 6,378,072 | B1 | 4/2002 | Collins et al. | 6,985,517 B2 | 1/2006 | Matsumoto et al. |
| 6,381,293 | B1 | 4/2002 | Lee et al. | 6,986,021 B2 | 1/2006 | Master et al. |
| 6,381,735 | B1 | 4/2002 | Hunt | 6,986,142 B1 | 1/2006 | Ehlig et al. |
| 6,385,751 | B1 | 5/2002 | Wolf | 6,988,139 B1 | 1/2006 | Jervis et al. |
| 6,405,214 | B1 | 6/2002 | Meade, II | 7,032,229 B1 | 4/2006 | Flores et al. |
| 6,408,039 | B1 | 6/2002 | Ito | 7,044,741 B2 | 5/2006 | Leem |
| 6,410,941 | B1 | 6/2002 | Taylor et al. | 7,082,456 B2 | 7/2006 | Mani-Meitav et al. |
| 6,411,612 | B1 | 6/2002 | Halford et al. | 7,139,910 B1 | 11/2006 | Ainsworth et al. |
| 6,421,372 | B1 | 7/2002 | Bierly et al. | 7,142,731 B1 | 11/2006 | Toi |
| 6,421,809 | B1 | 7/2002 | Wuytack et al. | 7,249,242 B2 | 7/2007 | Ramchandran |
| 6,426,649 | B1 | 7/2002 | Fu et al. | 2001/0003191 A1 | 6/2001 | Kovacs et al. |
| 6,430,624 | B1 | 8/2002 | Jamtgaard et al. | 2001/0023482 A1 | 9/2001 | Wray |
| 6,433,578 | B1 | 8/2002 | Wasson | 2001/0029515 A1 | 10/2001 | Mirsky |
| 6,434,590 | B1 | 8/2002 | Blelloch et al. | 2001/0034795 A1 | 10/2001 | Moulton et al. |
| 6,438,737 | B1 | 8/2002 | Morelli et al. | 2001/0039654 A1 | 11/2001 | Miyamoto |
| 6,456,996 | B1 | 9/2002 | Crawford, Jr. et al. | 2001/0048713 A1 | 12/2001 | Medlock et al. |
| 6,459,883 | B2 | 10/2002 | Subramanian et al. | 2001/0048714 A1 | 12/2001 | Jha |
| 6,467,009 | B1 | 10/2002 | Winegarden et al. | 2001/0050948 A1 | 12/2001 | Ramberg et al. |
| 6,469,540 | B2 | 10/2002 | Nakaya | 2002/0010848 A1 | 1/2002 | Kamano et al. |
| 6,473,609 | B1 | 10/2002 | Schwartz et al. | 2002/0013799 A1 | 1/2002 | Blaker |
| 6,483,343 | B1 | 11/2002 | Faith et al. | 2002/0013937 A1 | 1/2002 | Ostanevich et al. |
| 6,507,947 | B1 | 1/2003 | Schreiber et al. | 2002/0015435 A1 | 2/2002 | Rieken |
| 6,510,138 | B1 | 1/2003 | Pannell | 2002/0023210 A1 | 2/2002 | Tuomenoksa et al. |
| 6,510,510 | B1 | 1/2003 | Garde | 2002/0024942 A1 | 2/2002 | Tsuneki et al. |
| 6,538,470 | B1 | 3/2003 | Langhammer et al. | 2002/0024993 A1 | 2/2002 | Subramanian et al. |

| | | | |
|---|---|---|---|
| 2002/0031166 A1 | 3/2002 | Subramanian et al. | |
| 2002/0032551 A1 | 3/2002 | Zakiya | |
| 2002/0035623 A1 | 3/2002 | Lawande et al. | |
| 2002/0041581 A1 | 4/2002 | Aramaki | |
| 2002/0042907 A1 | 4/2002 | Yamanaka et al. | |
| 2002/0061741 A1 | 5/2002 | Leung et al. | |
| 2002/0069282 A1 | 6/2002 | Reisman | |
| 2002/0072830 A1 | 6/2002 | Hunt | |
| 2002/0078337 A1 | 6/2002 | Moreau et al. | |
| 2002/0083305 A1 | 6/2002 | Renard et al. | |
| 2002/0083423 A1 | 6/2002 | Ostanevich et al. | |
| 2002/0087829 A1 | 7/2002 | Snyder et al. | |
| 2002/0089348 A1 | 7/2002 | Langhammer | |
| 2002/0101909 A1 | 8/2002 | Chen et al. | |
| 2002/0107905 A1 | 8/2002 | Roe et al. | |
| 2002/0107962 A1 | 8/2002 | Richter et al. | |
| 2002/0119803 A1 | 8/2002 | Bitterlich et al. | |
| 2002/0120672 A1 | 8/2002 | Butt et al. | |
| 2002/0133688 A1 | 9/2002 | Lee et al. | |
| 2002/0138716 A1 | 9/2002 | Master et al. | |
| 2002/0141489 A1 | 10/2002 | Imaizumi | |
| 2002/0147845 A1 | 10/2002 | Sanchez-Herrero et al. | |
| 2002/0159503 A1 | 10/2002 | Ramachandran | |
| 2002/0162026 A1 | 10/2002 | Neuman et al. | |
| 2002/0168018 A1 | 11/2002 | Scheuermann | |
| 2002/0181559 A1 | 12/2002 | Heidari-Bateni et al. | |
| 2002/0184275 A1 | 12/2002 | Dutta et al. | |
| 2002/0184291 A1 | 12/2002 | Hogenauer | |
| 2002/0184498 A1 | 12/2002 | Qi | |
| 2002/0191790 A1 | 12/2002 | Anand et al. | |
| 2003/0007606 A1 | 1/2003 | Suder et al. | |
| 2003/0012270 A1 | 1/2003 | Zhou et al. | |
| 2003/0018446 A1 | 1/2003 | Makowski et al. | |
| 2003/0018700 A1 | 1/2003 | Giroti et al. | |
| 2003/0023830 A1 | 1/2003 | Hogenauer | |
| 2003/0026242 A1 | 2/2003 | Jokinen et al. | |
| 2003/0030004 A1 | 2/2003 | Dixon et al. | |
| 2003/0046421 A1 | 3/2003 | Horvitz et al. | |
| 2003/0061260 A1 | 3/2003 | Rajkumar | |
| 2003/0061311 A1 | 3/2003 | Lo | |
| 2003/0063656 A1 | 4/2003 | Rao et al. | |
| 2003/0074473 A1 | 4/2003 | Pham et al. | |
| 2003/0076815 A1 | 4/2003 | Miller et al. | |
| 2003/0099223 A1 | 5/2003 | Chang et al. | |
| 2003/0102889 A1 | 6/2003 | Master et al. | |
| 2003/0105949 A1 | 6/2003 | Master et al. | |
| 2003/0110485 A1 | 6/2003 | Lu et al. | |
| 2003/0131162 A1 | 7/2003 | Secatch et al. | |
| 2003/0142818 A1 | 7/2003 | Raghunathan et al. | |
| 2003/0154357 A1 | 8/2003 | Master et al. | |
| 2003/0163723 A1 | 8/2003 | Kozuch et al. | |
| 2003/0172138 A1 | 9/2003 | McCormack et al. | |
| 2003/0172139 A1 | 9/2003 | Srinivasan et al. | |
| 2003/0200538 A1 | 10/2003 | Ebeling et al. | |
| 2003/0212684 A1 | 11/2003 | Meyer et al. | |
| 2003/0229864 A1 | 12/2003 | Watkins | |
| 2004/0006584 A1 | 1/2004 | Vandeweerd | |
| 2004/0010645 A1 | 1/2004 | Scheuermann et al. | |
| 2004/0015970 A1 | 1/2004 | Scheuermann | |
| 2004/0025159 A1 | 2/2004 | Scheuermann et al. | |
| 2004/0057505 A1 | 3/2004 | Valio | |
| 2004/0062300 A1 | 4/2004 | McDonough et al. | |
| 2004/0081248 A1 | 4/2004 | Parolari | |
| 2004/0093479 A1 | 5/2004 | Ramchandran | |
| 2004/0133745 A1 | 7/2004 | Ramchandran | |
| 2004/0168044 A1 | 8/2004 | Ramchandran | |
| 2005/0044344 A1 | 2/2005 | Stevens | |
| 2005/0166038 A1 | 7/2005 | Wang et al. | |
| 2005/0166073 A1 | 7/2005 | Lee | |
| 2005/0198199 A1 | 9/2005 | Dowling | |
| 2006/0031660 A1 | 2/2006 | Master et al. | |

FOREIGN PATENT DOCUMENTS

| | | |
|---|---|---|
| EP | 0 661 831 A2 | 7/1995 |
| EP | 0 668 659 A2 | 8/1995 |
| EP | 0 690 588 A2 | 1/1996 |
| EP | 0 691 754 A2 | 1/1996 |
| EP | 0 768 602 A2 | 4/1997 |
| EP | 0 817 003 A2 | 1/1998 |
| EP | 0 821 495 A2 | 1/1998 |
| EP | 0 923 247 A2 | 6/1999 |
| EP | 0 926 596 A2 | 6/1999 |
| EP | 1 056 217 A2 | 11/2000 |
| EP | 1 061 437 A1 | 12/2000 |
| EP | 1 061 443 A2 | 12/2000 |
| EP | 1 126 368 A2 | 8/2001 |
| EP | 1 150 506 A2 | 10/2001 |
| EP | 1 189 358 A1 | 3/2002 |
| GB | 2 067 800 A | 7/1981 |
| GB | 2 237 908 A | 5/1991 |
| JP | 62-249456 | 10/1987 |
| JP | 63-147258 | 6/1988 |
| JP | 4-51546 | 2/1992 |
| JP | 7-064789 | 3/1995 |
| JP | 7066718 | 3/1995 |
| JP | 10233676 | 9/1998 |
| JP | 10254696 | 9/1998 |
| JP | 11296345 | 10/1999 |
| JP | 2000315731 | 11/2000 |
| JP | 2001-053703 | 2/2001 |
| WO | WO 93/13603 A1 | 7/1993 |
| WO | WO 96/33558 A1 | 10/1996 |
| WO | WO 98/32071 A3 | 7/1998 |
| WO | WO 99/21094 A2 | 4/1999 |
| WO | WO 00/19311 A1 | 4/2000 |
| WO | WO 00/65855 A1 | 11/2000 |
| WO | WO 00/69073 A1 | 11/2000 |
| WO | WO 01/22235 A1 | 3/2001 |
| WO | WO 01/76129 A2 | 10/2001 |
| WO | WO 02/12978 A2 | 2/2002 |

OTHER PUBLICATIONS

U.S. Appl. No. 11/803,998 Office Action Date Mailed Jul. 25, 2007.
U.S. Appl. No. 12/115,843 Office Action Date Mailed Sep. 9, 2009.
Abnous et al., "Ultra-Low-Power Domain-Specific Multimedia Processors," VLSI Signal Processing, IX, 1998, IEEE Workshop in San Francisco, CA, USA, Oct. 30-Nov. 1, 1998, pp. 461-470 (Oct. 30, 1998).
Aggarwal et al.., "Efficient Huffman Decoding," International Conference on Image Processing IEEE 1:936-939 (Sep. 10-13, 2000).
Allan et al., "Software Pipelining," ACM Computing Surveys, 27(3):1-78 (Sep. 1995).
Alsolaim et al., "Architecture and Application of a Dynamically Reconfigurable Hardware Array for Future Mobile Communication Systems," Field Programmable Custom Computing Machines, 2000 IEEE Symposium, Napa Valley, Los Alamitos, CA. IEEE Comput. Soc. pp. 205-214 (Apr. 17-19, 2000).
Ashenden et al., "The VHDL Cookbook," Dept. Computer Science, University of Adelaide, South Australia. Downloaded from http://tams-www.informatik.uni-hamburg.de/vhdl/doc/cookbook/VHDL-Cookbook.pdf on Dec. 7, 2006 (Jul. 1990).
Bacon et al., "Compiler Transformations for High-Performance Computing," ACM Computing Surveys 26(4):368-373 (Dec. 1994).
Balasubramonian et al., "Reducing the Complexity of the Register File in Dynamic Superscalar Processors," Proceedings of the 34th Annual ACM/IEEE International Symposium on Microarchitecture, pp. 237-248 (Dec. 1, 2001).
Banerjee et al., "A MATLAB Compiler for Distributed, Heterogeneous, Reconfigurable Computing Systems," 2000 IEEE Symposium, pp. 39-48, (Apr. 17-19, 2000).
Bapty et al., "Uniform Execution Environment for Dynamic Reconfiguration," Darpa Adaptive Computing Systems, http://isis.vanderbilt.edu/publications/archive/babty_T_#_0_1999_Uniform_Ex.pdf, pp. 1-7 (1999).
Baumgarte et al., "PACT XPP—A Self-Reconfigurable Data Processing Architecture," NN www.pactcorp.com/sneu/download/ersa01.pdf; retrieved on Nov. 25, 2005 (Jun. 25, 2001).
Becker et al., "An Application—Tailored Dynamically Reconfigurable Hardware Architecture for Digital Baseband Processing," IEEE Conference Proceedings Article pp. 341-346 (Sep. 18, 2000).
Becker et al., "Design and Implementation of a Coarse-Grained Dynamically Reconfigurable Hardware Architecture," VLSI 2001, Proceedings IEEE Computer Soc. Workshop, Piscataway, NJ, USA, pp. 41-46 (Apr. 19-20, 2001).

Bishop & Loucks, "A Heterogeneous Environment for Hardware/Software Cosimulation," Proceedings of the 30th Annual Simulation Symposium, pp. 14-22 (Apr. 7-9, 1997).

Brakensiek et al., "Re-Configurable Multi-Standard Terminal for Heterogeneous Networks," Radio and Wireless Conference, Rawcon 2002 IEEE. pp. 27-30 (2002).

Brown et al., "Quick PDA Data Exchange," PC Magazine pp. 1-3 (May 22, 2001).

Buck et al., "Ptolemy: A Framework for Simulating and Prototyping Heterogeneous Systems," International Journal of Computer Simulation 4:155-182 (Apr. 1994).

Burns et al., "A Dynamic Reconfiguration Run-Time System," Proceedings of the 5th Annual Symposium on Field-Programmable Custom Computing Machines, pp. 166-175 (Apr. 16, 1997).

Business Wire, "Whirlpool Internet-Enabled Appliances to Use Beeline Shopper Software Features," http://www.whirlpoocorp.com/news/releases/release.asp?rid=90 (Feb. 16, 2001).

Buttazzo et al., "Optimal Deadline Assignment for Scheduling Soft Aperiodic Tasks in Hard Real-Time Environments," Engineering of Complex Computer Systems, Proceedings of the Third IEEE International Conference on Como, pp. 39-48 (Sep. 8, 1997).

Callahan et al., "Adapting Software Pipelining for Reconfigurable Computing," in Proceedings of the International Conference on Compilers, Architectrue and Synthesis for Embedded Systems p. 8, ACM (CASES '00, San Jose, CA) (Nov. 17-18, 2000).

Chapman & Mehrotra, "OpenMP and HPF: Integrating Two Paradigms," Proceedings of the 4th International Euro-Par Conference (Euro-Par'98), Springer-Verlag Heidelberg, Lecture Notes in Computer Science 1470:650-658 (1998).

Chen et al., "A Reconfigurable Multiprocessor IC for Rapid Prototyping of Algorithmic-Specific High-Speed DSP Data Paths," IEEE Journal of Solid-State Circuits, IEEE 35:74-75 (Feb. 1, 2001).

Clarke, "Embedded Solutions Enters Development Pact with Marconi," EETimes Online (Jan. 26, 2000).

Compton & Hauck, "Reconfigurable Computing: A Survey of Systems and Software," ACM Press, ACM Computing Surveys (CSUR) 34(2):171-210 (Jun. 2002).

Compton et al., "Configuration Relocation and Defragmentation for Run-Time Reconfigurable Computing," Northwestern University, http://citeseer.nj.nec.com/compton00configuration.html, pp. 1-17 (2000).

Conte et al., "Dynamic Rescheduling: A Technique for Object Code Compatibility in VLIW Architectures," Proceedings of the 28th Annulal International Symposium on Microarchitecture pp. 208-218 (Nov. 29, 1995).

Conte et al., "Instruction Fetch Mechanisms for VLIW Architectures with Compressed Encodings," Proceedings of the Annual IEEE/ACM International Symposium on Microarchitecture (MICRO) 29:201-211 (Dec. 2, 1996).

Cray Research Inc., "Cray T3E Fortran Optimization Guide," Ver. 004-2518-002, Section 4.5 (Jan. 1999).

Cummings et al., "FPGA in the Software Radio," IEEE Communications Magazine. 37(2):108-112 (Feb. 1999).

Dandalis et al., "An Adaptive Cryptograhic Engine for IPSec Architectures," IEEE pp. 132-141 (Jan. 2000).

David et al., "DART: A Dynamically Reconfigurable Architecture Dealing with Future Mobile Telecommunication Constraints," Proceedings of the International Parallel and Distributed Processing Symposium pp. 156-163 (Apr. 15, 2002).

Deepakumara et al., "FPGA Implementation of MD5 has Algorithm," Canadian Conference on Electrical and Computer Engineering, IEEE (2001).

DeHon et al., "Reconfigurable Computing: What, Why and Implications for Design Automation," Design Automation Conference Proceedings pp. 610-615 (1999).

Dipert, "Figuring Out Reconfigurable Logic," EDN 44(16):107-114 (Aug. 5, 1999).

Dominikus, "A Hardware Implementation of MD4-Family Hash Algorithms," 9th International Conference on Electronics, Circuits and Systems IEEE (2002).

Dorband, "aCe C Language Reference Guide," Online (Archived Mar. 2001), http://web.archive.org/web/20000616053819/http://newton.gsfc.nasa.gov/ aCe/aCe_dir/aCe_cc_Ref.html (Mar. 2001).

Drozdowski, "Scheduling Multiprocessor Tasks—An Overview," Instytut Informatyki Politechnika, pp. 1-31 (Jan. 31, 1996).

Ebeling et al., "RaPiD Reconfigurable Pipelined Datapath," Springer-Verlag, 6th International Workshop on Field-Programmable Logic and Applications pp. 126-135 (1996).

Fawer et al., "A Multiprocessor Approach for Implementing a Time-Diversity Spread Specturm Receiver," Proceeding sof the 1990 International Zurich Seminal on Digital Communications, pp. 173-180 (Mar. 5-8, 1990).

Fisher, "Gone Flat," Forbes pp. 76-79 (Oct. 2001).

Fleischmann et al., "Prototyping Networked Embedded Systems," Integrated Engineering, pp. 116-119 (Feb. 1999).

Forbes "Best of the Web—Computer Networking/Consumer Durables," *The Forbes Magnetic 40* p. 80 (May 2001).

Gibson, "Fresh Technologies Will Create Myriad Functions," FT Information Technology Review; World Wide Web at http://technews.acm.org/articles/2000-2/0301w. html?searchterm=%22fresh+technologies%22 (Mar. 1, 2000).

Glutii, "Integrierte Signalprozessoren," Elektronik 35(18):112-118 Franzis Verlag GMBH, Munich, Germany (Sep. 5, 1986).

Gokhale & Schlesinger, "A Data Parallel C and Its Platforms," Proceedings of the Fifth Symposium on the Frontiers of Massively Parallel Computation pp. 194-202 (Frontiers '95) (Feb. 1995).

Grimm et al., "A System Architecture for Pervasive Computing," Washington University, pp. 1-6 (Sep. 2000).

Halbwachs et al., "The Synchronous Data Flow Programming Language LUSTRE," Proceedings of the IEEE 79(9):1305-1319 (Sep. 1991).

Hammes et al., "Cameron: High Level Language Compilation for Reconfigurable Systems," Proc. of the Intl. Conf. on Parallel Architectures and Compilation Techniques, pp. 236-244 (Oct. 1999).

Hartenstein, "Coarse Grain Reconfigurable Architectures," Design Automation Conference, 2001. Proceedings of the ASP-Dac 2001, Asian and South Pacific Jan. 30, 2001-Feb. 2, 2001, Piscataway, Nj, US, IEEE, pp. 564-569 (Jan. 30, 2001).

Heinz, "An Efficiently Compilable Extension of {M} odula-3 for Problem-Oriented Explicitly Parallel Programming," Proceedings of the Joint Symposium on Parallel Processing (May 1993).

Hinden et al., "The DARPA Internet: Interconnecting Heterogeneous Computer Networks with Gateways," IEEE Computer Magazine pp. 38-48 (1983).

Horton, "Beginning Java 2: JDK 1.3 Edition," Wrox Press, Chapter 8, pp. 313-316 (Feb. 2001).

Huff et al., "Lifetime-Sensitive Modulo Scheduling," 6th Conference on Programming Language, Design and Implementation, pp. 258-267, ACM (1993).

IBM, "Multisequencing a Single Instruction Stream Scheduling with Space-time Trade-offs," IBM Technical Disclosure Bulletin 36(2):105-108 (Feb. 1, 1993).

IEEE, "IEEE Standard Verilog Hardware Description Language," downloaded from http://inst.eecs.berkeley.edu/~cs150/fa06/Labs/verilog-ieee.pdf on Dec. 7, 2006 (Sep. 2001), pp. 1-5.

Internet Wire, Sunbeam Joins Microsoft in University Plug and Play Forum to Establish A "Universal" Smart Appliance Technology Standard (Mar. 23, 2000).

Ishii et al., "Parallel Variable Length Decoding with Inverse Quantization for Software MPEG-2 Decoders," Workshop on Signal Processing Systems, Design and Implementation, IEEE pp. 500-509 (Nov. 3-5, 1997).

Jain et al., "An Alternative Approach Towards the Design of Control Units," Microelectronics and Reliability 24(6):1009-1012 (1984).

Jain, "Parallel Processing with the TMS320C40 Parallel Digital Signal Proccssor," Sonitech International Inc., pp. 13-46. Retrieved from: http://www-s.ti.com/sc/psheets/spra031/spra031.pdf retrieved on Apr. 14, 2004 (Feb. 1994).

Janssen et al., "Partitioned Register File for TTAs," Proceedings of the 28th Annual International Symposium on Microarchitecture, pp. 303-312 (Nov. 1995).

Jung et al., "Efficient Hardware Controller Synthesis for Synchronous Dataflow Graph in System Level Design," Proceedings of the 13th International Symposium on System Synthesis pp. 79-84 (ISSS'00) (Sep. 2000).

Kaufmann et al., "Digital Spread-Spectrum Multipath-Diversity Receiver for Indoor Communication," from Pioneers to the 21st Century; Denver, Proceedings of the Vehicular Technology Socity [sic] Conference, NY, IEEE, US 2(Conf. 42):1038-1041 (May 10-13, 1992).

Kneip et al., "An Algorithm Adapted Autonomous Controlling Concept for a Parallel Single-Chip Digital Signal Processor," Journal of VLSI Signal Processing Systems for Signal, Image, an dVideo Technology 16(1):31-40 (May 1, 1997).

Lee & Messerschmitt, "Pipeline Interleaved Programmable DSP's: Synchronous Data Flow Programming," IEEE Transactions on Acoustics, Speech, and Signal Processing ASSP-35(9):1334-1345 (Sep. 1987).

Lee & Messerschmitt, "Synchronous Data Flow," Proceedings of the IEEE 75(9):1235-1245 (Sep. 1987).

Lee & Parks, "Dataflow Process Networks," Proceedings of the IEEE 83(5):773-799 (May 1995).

Liu et al., "Scheduling Algorithms for Multiprogramming in a Hard-Real-Time Environment," *Journal of the Association for Computing* 20(1):46-61 (1973).

Llosa et al., "Lifetime-Sensitive Modulo Scheduling in a Production Environment," IEEE Trans. on Comps. 50(3):234-249 (Mar. 2001).

Lu et al., "The Morphosys Dynamically Reconfigurable System-On-Chip," Proceedings of the First NASA/DOD Workshop on Evolvable Hardware, pp. 152-160 (Jul. 19, 1999).

Mangione-Smith et al., "Seeking Solutions in Configurable Computing," *Computer* 30(12):38-43 (Dec. 1997).

Mannion, "Networking CPU Adds Spice," Electronic Engineering Times, Issue 1126 (Aug. 14, 2000).

Mascia & Ishii., "Neural Net Implementation on Single-Chip Digital Signal Processor," IEEE (1989).

McGraw, "Parallel Functional Programming in Sisal: Fictions, Facts, and Future," Lawrence Livermore National Laboratory pp. 1-40 (Jul. 1993).

Najjar et al., "High-Level Language Abstraction for Reconfigurable Computing," *Computer* 36(8):63-69 (Aug. 2003).

Nichols et al., "Data Management and Control-Flow Constructs in a SIMD/SPMD Parallel Language/Compiler," Proceedings of the 3rd Symposium on the Frontiers of Massively Parallel Computation pp. 397-406 (Oct. 1990).

OpenMP Architecture Review Board, "OpenMP C and C++ Application Program Interface," pp. 7-16 (Oct. 1998).

Oracle Corporation, "Oracle8i JDBC Developer's Guide and Reference," Release 3, 8.1.7, pp. 10-8-10-10 (Jul. 2000).

Pauer et al., "Algorithm Analysis and Mapping Environment for Adaptive Computing Systems: Further Results," Proc. IEEE Symposium on FPGA's for Custom Computing Machines (FCCM), Napa CA (1999).

Pauer et al., "Algorithm Analysis and Mapping Environment for Adaptive Computing Systems," Presentation slides, Third Bi-annual Ptolemy Miniconference (1999).

Ramamritham et al., "On Scheduling Algorithms for Real-Time Multiprocessor Systems," Algorithms and Applications, Proceedings of the International conference on Parallel Processing 3:143-152 (Aug. 8, 1989).

Schneider, "A Parallel/Serial Trade-Off Methodology for Look-Up Table Based Decoders," Proceedings of the Design Automation Conference 34:498-503 (Jun. 9-13, 1997).

Sidhu et al., "A Self-Reconfigurable Gate Array Architecture," 10 International Workshop on Field Programmable Logic and Applications http://coblitz.codeen.org:3125/citeseer.ist.psu.edu/cache/papers/cs/17524/http:zSzzSzmaarcii.usc.eduzSzPublicationsZSzsidhu_fp100.pdf/sidhu00selfreconfigurable.pdf retrieved on Jun. 21, 2006 (Sep. 1, 2001).

Smith, "Intro to ASICs: ASIC Cell Libraries," at http://iroi.seu.edu.cn/books/asics/Book2/CH01/CH01.5.htm, printed on Feb. 4, 2005 (Jun. 1997).

Souza, "Computing's New Face—Reconfigurable Devices Could Rattle Supply Chain," Electronic Buyers' News Issue 1205, p. P.1 (Apr. 3, 2000).

Souza, "Quicksilver Buys White Eagle," Electronic Buyers News, Issue 1220 (Jul. 17, 2000).

Sriram et al., "MPEG-2 Video Decoding on the TMS320C6X DSP Architecture," Conference Record of the 32nd Asilomar Conference on Signals, Systems, and Computers, IEEE pp. 1735-1739 (Nov. 1-4, 1998).

Sun Microsystems, "Fortran 3.0.1 User's Guide, Revision A," pp. 57 and 68 (Aug. 1994).

Svensson, "Co's Join on Home Web Wiring Network," Associated Press Online printed on Apr. 30, 2008 (Jun. 2000).

Tang et al., "Thread Partitioning and Scheduling Based on Cost Model," Proceedings of the Ninth Annual ACM Symposium on Parallel Algorithms and Architectures, pp. 272-281 Retrieved from: http://doi.acm.org/10.1145/258492.2585 retrieved on Aug. 25, 2004 (1997).

Vaya, "VITURBO: A Reconfigurable Architecture for Ubiquitous Wireless Networks," A Thesis Submitted in Partial Fulfillment of the Requirements for the Degree Master of Science; Rice University (Aug. 2002).

Wang et al., "Cell Search in W-CDMA," IEEE Journal on Selected Areas in Communications 18(8):1470-1482 (Aug. 2000).

Whiting & Pascoe, "A History of Data-Flow Languages," IEEE Annals of the History of Computing 16(4):38-59 (1994).

Williamson & Lee, "Synthesis of Parallel Hardware Implementations from Synchronous Dataflow Graph Specifications," Conference Record of the Thirtieth Asilomar Conference on Signals, Systems and Computers 1340-1343 (Nov. 1996).

Wirthlin et al., "A Dynamic Instruction Set Computer," Proceedings of the IEEE Symposium on FPGA's for Custom Computing Machines, pp. 99-107 (Apr. 21, 1995).

WWW.APPLIANCEMAGAZINE.COM, World Wide Web at http://web.archive.org/web/20000511085402/http://www.appliancemagazine.com/ printed on Apr. 30, 2008.

WWW.BESTROM.COM, BreakMateTM from www.bestrom.com printed on Apr. 29, 2008.

WWW.BONATOR.COM, from the World Wide Web at http://web.archive.org/web/20000510102440/http://www.bonator.com/ printed on Apr. 30, 2008.

WWW.GATEWAY.COM, World Wide Web, http://web.archive.org/web/20000229192734/www.gateway.com/productpages/9300splash/index.shtml Available on Mar. 3, 2000, 1 page (Mar. 3, 2000).

WWW.ICL.COM, from the World Wide Web at http://www.icl.com printed on Apr. 30, 2008.

WWW.MARGHERITA2000.COM; from Margherita2000.com printed Apr. 30, 2008 (Jan. 26, 2001).

Xilinx, "Virtex-II Pro Platform FPGAs: Functional Description DS083-2 (v2.5)," Product Specification, pp. 13-46 (Jan. 20, 2003).

Young, "Architecture Powers up IPSec, SSL," EETimes, Los Gatos, CA, pp. 1-4 http://www.eetimes.com/story/OEG20011102S0065 (Nov. 2, 2001).

Yuan et al., "A Decomposition Approach to Non-Preemptive Real-Time Scheduling," Real Time Systems 6(1):7-35 (1994).

Zaino et al., "Algorithm Analysis and Mapping Environment for Adaptive Computing Systems," Final Technical Report, DARPA Contract F33615-97-C-1174 (Sep. 2001).

Zhang et al., "A 1V Heterogeneous Reconfigurable Processor IC for Baseband Wireless Applications," 2000 IEEE Solid.

Altera Apex 20K 1999.

Andraka Consulting Group, "Distributed Arithmetic," Obtained from: http://www.fpga-guru.com/distribu.htm (1998-2000).

Computer Organization and Design $2^{nd}$ Edition, Hennessy, Morgan Kaufmann Publishers, pp. 569-570 (1998).

Free On-Line Dictionary of Computing. © 1995-2000 www.foldoc.org search terms: cache, operating system, Internet, DMA, interrupt.

Hanna et al., "A Normalized Backpropagation Learning Algorithm for Multilayer Feed-Forward Neural Adaptive Filters," *Neural Networks for Signal Processing XI*, Proceedings of the 2001 IEEE Signal Processing Society Workshop pp. 63-72 (Sep. 2001).

Janweijer et al., "A Compact Robin Using the SHarc (CRUSH)," Obtained from: http://www.nikhef.nl/~peterj/Crush/CRUSH-hw.pdf (Sep. 1998).

Rajagopalan et al., "A Flexible Multiplication Unit for an FPGA Logic Block," *Circuits and Systems* 4:546-9 (2001).

Xilinx Data Book 1998.

Xilinx Virtex-E 1.8V Extended Memory FPGAS, 2000.

Xilinx Virtex-E 1.8V Extended Memory FPGAS, 2002.

Jong-Pyng et al., "Real-Time Virtual Channel Flow Control," Proceedings of the Annual International Phoenix Conference on Computers and Communications, Conf. 13, pp. 97-103 (Apr. 12, 1994).

EXTERNAL MEMORY CONTROLLER NODE

CLAIM OF PRIORITY

This application claims priority from U.S. Provisional Patent Application No. 60/428,646, filed on Nov. 22, 2002. This application is a continuation from U.S. patent application Ser. No. 12/115,843 filed May 6, 2008, which is a continuation of U.S. patent application Ser. No. 11/803,998 filed May 16, 2007, which is a continuation of U.S. patent application Ser. No. 10/719,921, now U.S. Pat. No. 7,225,301 filed Nov. 20, 2003 which claims priority from U.S. Provisional Application No. 60/428,646. Priority is claimed from all of these applications and these applications are hereby incorporated by reference as if set forth in full in this application for all purposes.

CROSS REFERENCE TO RELATED APPLICATIONS

This application is related to the following U.S. patent applications, each of which is hereby incorporated by reference as if set forth in full in this document for all purposes:

Ser. No. 09/815,122, entitled "Adaptive Integrated Circuitry with Heterogeneous and Reconfigurable Matrices of Diverse and Adaptive Computational Units having Fixed, Application Specific Computational Elements," filed on Mar. 22, 2001;

Ser. No. 10/443,554, entitled "Uniform Interface for a Functional Node in an Adaptive Computing Engine," filed on May 21, 2003.

BACKGROUND OF THE INVENTION

The present invention is related in general to memory controllers and more specifically to the design of a memory controller for use in an adaptive computing environment.

The advances made in the design and development of integrated circuits ("ICs") have generally produced information-processing devices falling into one of several distinct types or categories having different properties and functions, such as microprocessors and digital signal processors ("DSPs"), application specific integrated circuits ("ASICs"), and field programmable gate arrays ("FPGAs"). Each of these different types or categories of information-processing devices have distinct advantages and disadvantages.

Microprocessors and DSPs, for example, typically provide a flexible, software-programmable solution for a wide variety of tasks. The flexibility of these devices requires a large amount of instruction decoding and processing, resulting in a comparatively small amount of processing resources devoted to actual algorithmic operations. Consequently, microprocessors and DSPs require significant processing resources, in the form of clock speed or silicon area, and consume significantly more power compared with other types of devices.

ASICs, while having comparative advantages in power consumption and size, use a fixed, "hard-wired" implementation of transistors to implement one or a small group of highly specific tasks. ASICs typically perform these tasks quite effectively; however, ASICs are not readily changeable, essentially requiring new masks and fabrication to realize any modifications to the intended tasks.

FPGAs allow a degree of post-fabrication modification, enabling some design and programming flexibility. FPGAs are comprised of small, repeating arrays of identical logic devices surrounded by several levels of programmable interconnects. Functions are implemented by configuring the interconnects to connect the logic devices in particular sequences and arrangements. Although FPGAs can be reconfigured after fabrication, the reconfiguring process is comparatively slow and is unsuitable for most real-time, immediate applications. Additionally, FPGAs are very expensive and very inefficient for implementation of particular functions. An algorithmic operation implemented on an FPGA may require orders of magnitude more silicon area, processing time, and power than its ASIC counterpart, particularly when the algorithm is a poor fit to the FPGA's array of homogeneous logic devices.

An adaptive computing engine (ACE) or adaptable computing machine (ACM) allows a collection of hardware resources to be rapidly configured for different tasks. Resources can include, e.g., processors, or nodes, for performing arithmetic, logical and other functions. The nodes are provided with an interconnection system that allows communication among nodes and communication with resources such as memory, input/output ports, etc. One type of valuable processing is memory access services. In order to provide memory access services to access external memory, an external memory controller is typically needed.

Thus, there is a desire to provide a memory controller that provides memory access services in an adaptive computing engine.

BRIEF SUMMARY OF THE INVENTION

Embodiments of the present invention generally relate to using a memory controller to provide memory access services in an adaptive computing engine.

In one embodiment, a memory controller in an adaptive computing engine (ACE) is provided. The controller includes a network interface configured to receive a memory request from a programmable network; and a memory interface configured to access a memory to fulfill the memory request from the programmable network, wherein the memory interface receives and provides data for the memory request to the network interface, the network interface configured to send data to and receive data from the programmable network.

In another embodiment, a memory controller includes a network interface configured to receive a memory request for a memory access service from a network; and one or more engines configured to receive the memory request and to provide the memory access service associated with the memory request.

In yet another embodiment, a memory controller includes one or more ports configured to receive memory requests, wherein each port includes one or more parameters; an engine configured to receive a memory request from a port in the one or more ports; and a data address generator configured to generate a memory location for a memory based on the one or more parameters associated with the port, wherein the engine is configured to perform a memory operation for the memory request using the generated memory location.

In another embodiment, a memory controller includes one or more ports configured to receive memory requests from requesting nodes, wherein each port includes one or more parameters, the one or more parameters configurable by information in the memory requests; a point-to-point engine configured to receive a memory request from a port in the one or more ports; a data address generator configured to generate a memory location for a memory based on the one or more parameters associated with the port, wherein the point-to-point engine performs a memory operation using the generated memory location while adhering to a point-to-point protocol with the requesting node.

In another embodiment, a system for processing memory service requests in an adaptable computing environment is provided. The system comprises: a memory; one or more nodes configured to generate a memory service request; a memory controller configured to receive the memory service request, the memory controller configured to service the memory service request, wherein the memory controller reads or writes data from or to the memory based on the memory service request.

A further understanding of the nature and the advantages of the inventions disclosed herein may be realized by reference of the remaining portions of the specification and the attached drawings.

DETAILED DESCRIPTION OF THE INVENTION

A preferred embodiment of the invention uses an adaptive computing engine (ACE) architecture including an external memory controller (XMC) node. Details of an exemplary ACE architecture are disclosed in the U.S. patent application Ser. No. 09/815,122, entitled "Adaptive Integrated Circuitry with Heterogeneous and Reconfigurable Matrices of Diverse and Adaptive Computational Units having Fixed, Application Specific Computational Elements," referenced, above.

Figure 1:
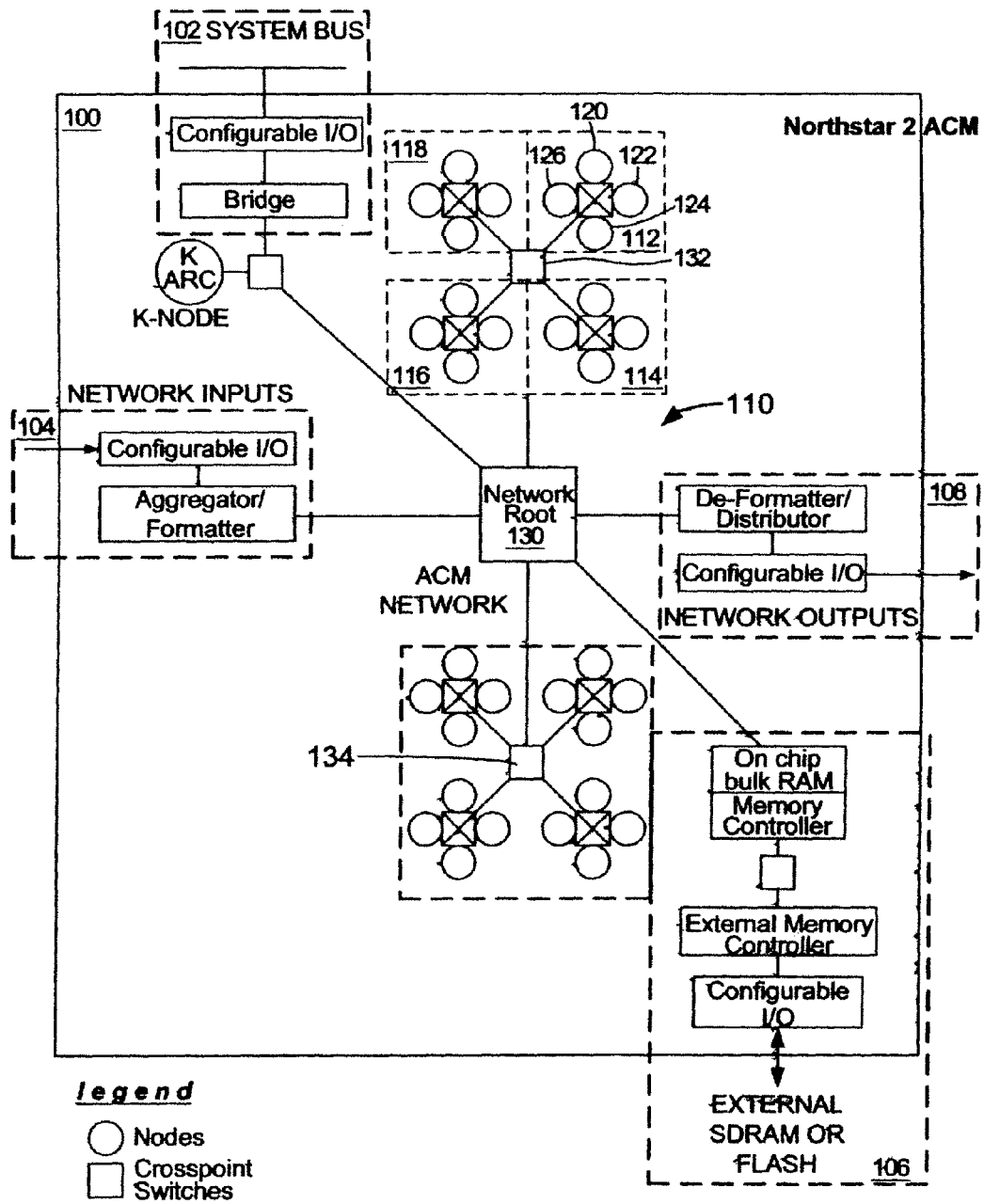
FIG. 1 illustrates an embodiment of an ACE device.

In general, the ACE architecture includes a plurality of heterogeneous computational elements coupled together via a programmable interconnection network. FIG. 1 illustrates an embodiment 100 of an ACE device. In this embodiment, the ACE device is realized on a single integrated circuit. A system bus interface 102 is provided for communication with external systems via an external system bus. A network input interface 104 is provided to send and receive real-time data. An external memory interface 106 is provided to enable the use of additional external memory devices, including SDRAM or flash memory devices. A network output interface 108 is provided for optionally communicating with additional ACE devices, as discussed below with respect to FIG. 2.

A plurality of heterogeneous computational elements (or nodes), including computing elements 120, 122, 124, and 126, comprise fixed and differing architectures corresponding to different algorithmic functions. Each node is specifically adapted to implement one of many different categories or types of functions, such as internal memory, logic and bit-level functions, arithmetic functions, control functions, and input and output functions. The quantity of nodes of differing types in an ACE device can vary according to the application requirements.

Because each node has a fixed architecture specifically adapted to its intended function, nodes approach the algorithmic efficiency of ASIC devices. For example, a binary logical node may be especially suited for bit-manipulation operations such as, logical AND, OR, NOR, XOR operations, bit shifting, etc. An arithmetic node may be especially well suited for math operations such as addition, subtraction, multiplication, division, etc. Other types of nodes are possible that can be designed for optimal processing of specific types.

Programmable interconnection network 110 enables communication among a plurality of nodes such as 120, 122, 124 and 126, and interfaces 102, 104, 106, and 108. The programmable interconnection network can be used to reconfigure the ACE device for a variety of different tasks. For example, changing the configuration of the interconnections between nodes can allow the same set of heterogeneous nodes to implement different functions, such as linear or non-linear algorithmic operations, finite state machine operations, memory operations, bit-level manipulations, fast-Fourier or discrete-cosine transformations, and many other high level processing functions for advanced computing, signal processing, and communications applications.

In one embodiment, programmable interconnection network 110 comprises a network root 130 and a plurality of crosspoint switches, including switches 132 and 134. In one embodiment, programmable interconnection network 110 is logically and/or physically arranged as a hierarchical tree to maximize distribution efficiency. In this embodiment, a number of nodes can be clustered together around a single crosspoint switch. The crosspoint switch is further connected with additional crosspoint switches, which facilitate communication between nodes in different clusters. For example, cluster 112, which comprises nodes 120, 122, 124, and 126, is connected with crosspoint switch 132 to enable communication with the nodes of clusters 114, 116, and 118. Crosspoint switch is further connected with additional crosspoint switches, for example crosspoint switch 134 via network root 130, to enable communication between any of the plurality of nodes in ACE device 100.

Figure 2:
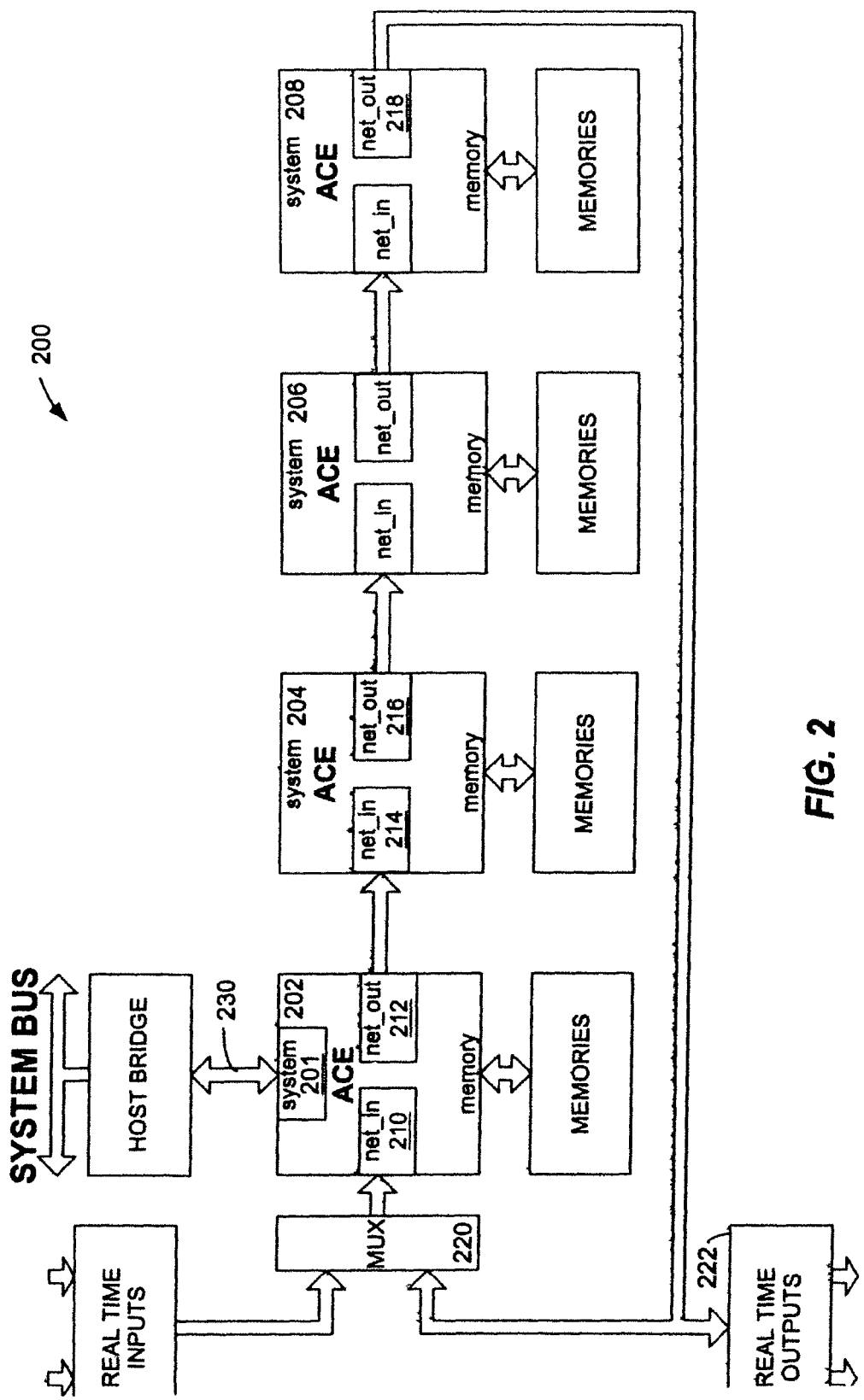
FIG. 2 shows a plurality of ACE devices, each having a plurality of nodes, connected together in a development system.

The programmable interconnection network (PIN) 110, in addition to facilitating communications between nodes within ACE device 100, also enables communication with nodes within other ACE devices via network inputs and outputs interfaces 104 and 108, respectively, and with other components and resources through other interfaces such as 102 and 106. FIG. 2 shows a plurality of ACE devices 202, 204, 206, and 208, each having a plurality of nodes, connected together in a development system 200. The system bus interface of ACE device 202 communicates with external systems via an external system bus. Real-time input is communicated to and from ACE device 202 via a network input interface 210. Real-time inputs and additional data generated by ACE device 202 can be further communicated to ACE device 204 via network output interface 212 and network input interface 214. ACE device 204 communicates real-time inputs and additional data generated by either itself or ACE device 202 to ACE device 206 via network output interface 216. In this manner, any number of ACE devices may be coupled together to operate in parallel. Additionally, the network output interface 218 of the last ACE device in the series, ACE device 208, communicates real-time data output and optionally forms a data feedback loop with ACE device 202 via multiplexer 220.

Figure 3:
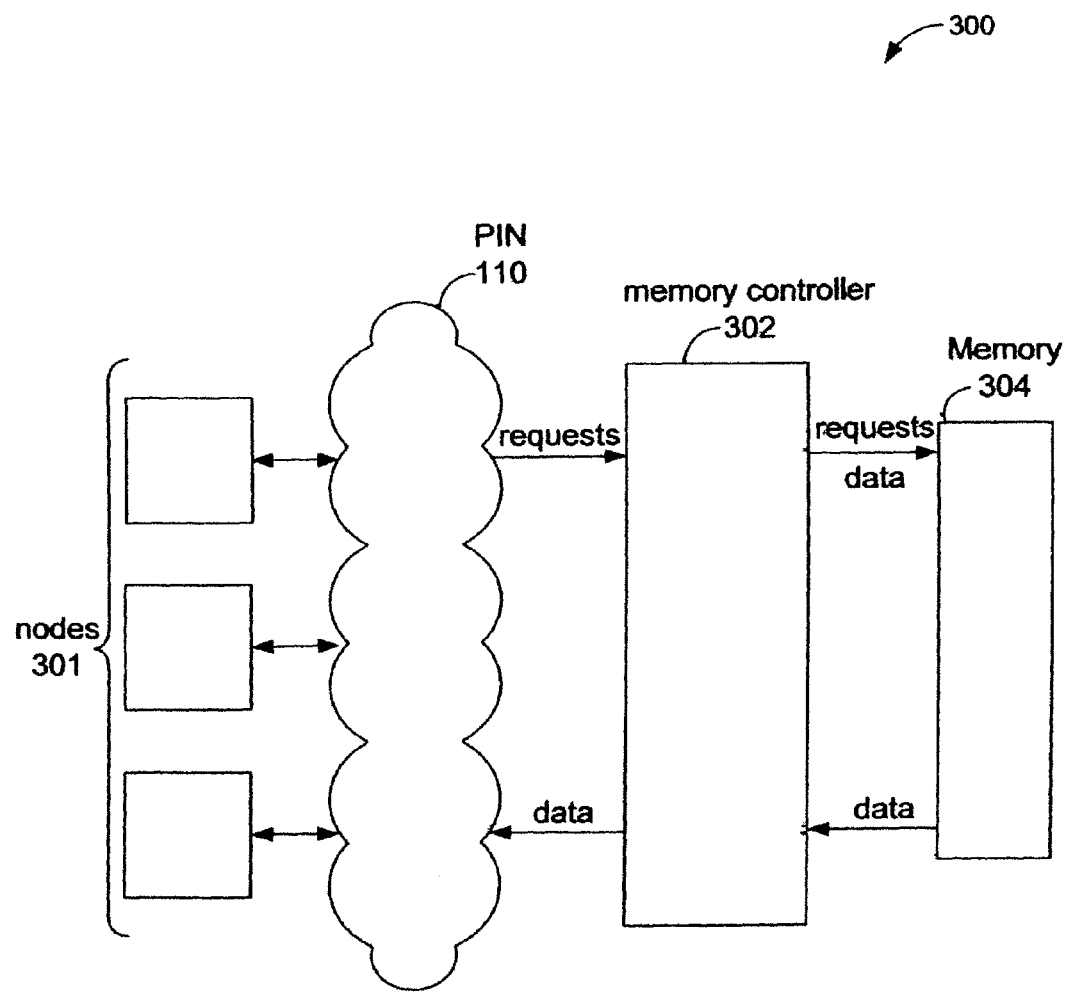
FIG. 3 is a block diagram of a system for performing memory access services according to one embodiment of the present invention.

In accordance with embodiments of the present invention, a memory controller is used to provide memory access services in an ACE architecture. FIG. 3 is a high-level block diagram that illustrates the basic concepts of a system 300 for performing memory access services according to one embodiment of the present invention. As shown, system 300 includes PIN 110, nodes 301, a memory controller 302, and a memory 304.

Nodes 301 can be any nodes, (e.g., computational elements or resources) in a computing device. Nodes 301 initiate memory service requests to memory controller 302. For example, nodes 301 can initiate read and write commands. If a read command is initiated, the requesting node is considered a "consumer" in that it consumes data read from memory 304 and if a write command is initiated, the requesting node is considered a "producer" in that it produces data to be written to memory 304. The read and write commands may be in the form of different memory access services that are described below.

PIN 110 receives memory service requests from nodes 301 in the ACE device. Additionally, PIN 110 receives and/or sends data from/to memory controller 302 and receives and/or sends the data from/to the requesting nodes in the ACE device.

Memory controller 302 receives memory access service requests from PIN 110 and processes the requests accordingly. In one embodiment, the services provided by memory controller 302 include a peek and poke service, a memory random access (MRA) service, a direct memory access (DMA) service, a point-to-point (PTP) service, a real-time input (RTI) service and a message service. The peek and poke service allows a requesting node to peek (retrieve) data and poke (write) data found in memory controller 302. A memory random access (MRA) service allows a requesting node to do a read and write to memory 304. A direct memory access (DMA) service allows a requesting node to request large blocks of data from memory 304. A point-to-point (PTP) service allows a requesting node to read and write data, and update port parameters, in a process that conforms to a point-to-point protocol. In one embodiment, the PTP service is used to read and write real-time streaming data. The real-time input (RTI) service performs the same service as to PTP service but uses a reduced acknowledgement protocol. Additionally, memory controller 304 provides messaging to nodes in the ACE device. For example, memory controller 302 can provide confirmation acknowledgement messages to requesting nodes that may be used for flow control.

In one embodiment, memory 304 is an external memory for an ACE device. Memory 304 receives memory service requests from memory controller 302 and provides data to memory controller 302 when a read operation is requested. Additionally, memory controller 302 may provide data to memory 304 that is to be written to memory 304. Memory 304 may be any memory, such as, a synchronous dynamic random access memory (SDRAM), a flash memory, static random access memory (SRAM) and the like.

The above-mentioned services that may be provided by memory controller 302 will now be described. Although the following memory services are described, it will be understood that a person skilled in the art will appreciate other memory services that memory controller 302 may provide.

Flow control is provided for a poke request in that a requesting poke waits for a poke acknowledgement before initiating a new poke to the same memory. In the case where multiple services are provided in memory 304, multiple requests to different memories may be allowed.

Figure 4:
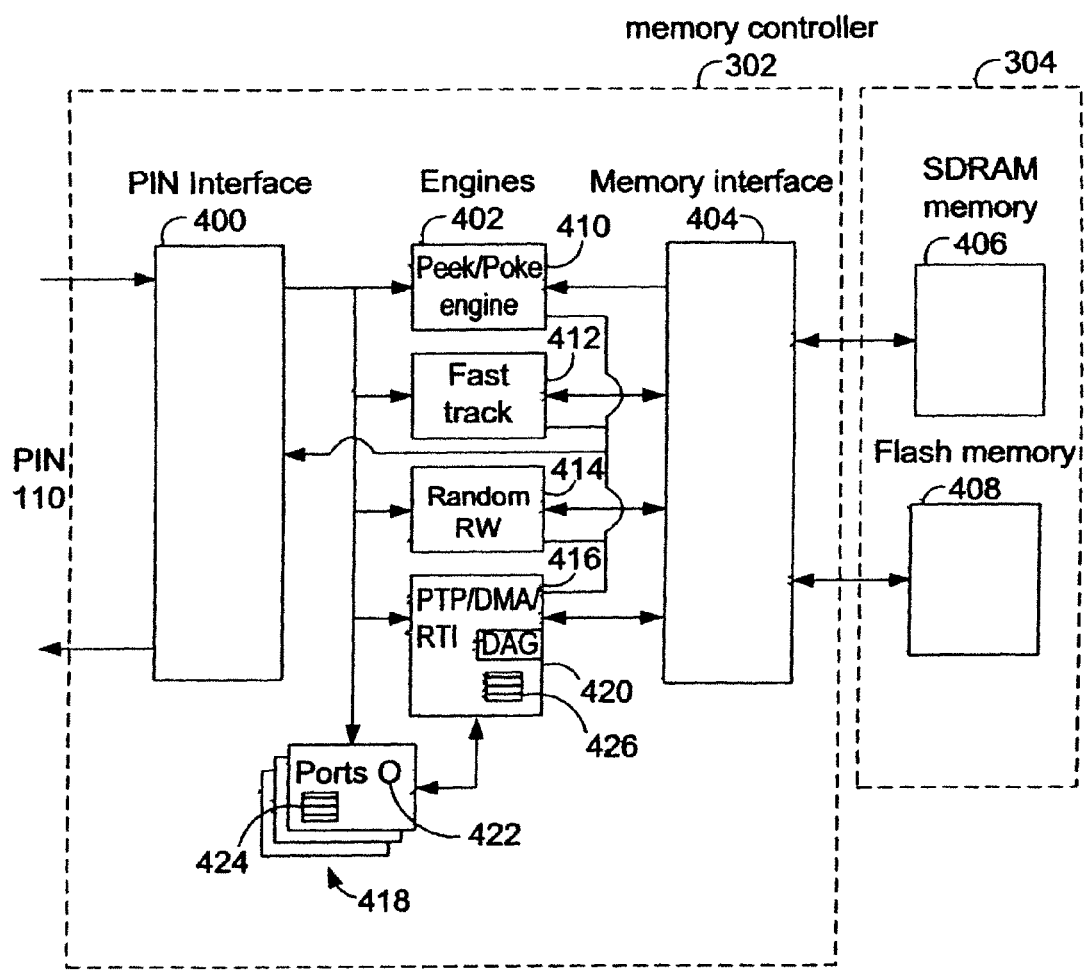
FIG. 4 illustrates a more detailed block diagram of memory controller according to one embodiment of the present invention.

FIG. 4 illustrates a more detailed block diagram of memory controller 302 according to one embodiment of the present invention. As shown, memory controller 302 includes a PIN interface 400, one or more engines 402, and a memory interface 404. Additionally memory 304 includes an SDRAM memory 406 and a flash memory 408.

PIN interface 400 is configured to receive memory service requests from PIN 110. Additionally, PIN interface 400 is configured to send data or any other messages to PIN 110. In one embodiment, PIN interface 400 includes a distributor, input arbiter, and an aggregator. The distributor and arbiter facilitate distributing data to one or more engines 402. The aggregator aggregates words that will be sent to nodes. When a request is received at PIN interface 400, PIN interface 400 determines which engine in engines 402 to send the request to.

In one embodiment, PIN interface 400 also provides a priority system for memory service requests. For example, one memory priority system may give a peek/poke memory service request the highest priority. Random read requests that are received with a fast track or higher priority indication are then given the next highest priority. All other requests are given a lowest priority. For example, random memory access requests are placed on a 132 entry first come first serve queue, DMA and PTP requests are placed on a single 64 entry first come first serve queue and these two queues are serviced on a round robin basis.

As shown, one or more engines 402 includes a peek/poke engine 410, a fast track engine 412, a random read/write engine 414, and a PTP/DMA/RTI engine 416 according to one embodiment of the invention. Although these engines 402 are described, a person skilled in the art will appreciate that other engines may be provided to perform functions related to the memory access services. Engines 402 process a memory service request and provide the appropriate request to memory interface 404 to fulfill the memory service request. For example, engines 402 determine a memory address that data should be read from in memory 304 or the data and a memory address in which data should be written to in memory 304. The action is then performed according to a protocol associated with the memory service request.

Memory interface 404 receives memory service requests from memory interface 404 and provides them to SDRAM memory 406 and/or flash memory 408. Although SDRAM memory 406 and flash memory 408 are shown, it will be understood that a person skilled in the art will appreciate other memories that may be used.

The types of services that are provided by engines 402 will now be described.

When a peek memory service request is received at PIN interface 400, it determines that the request should be sent to peek/poke engine 410. The peek request is received in one or more data words and PIN interface 400 is configured to determine from data in the data words that a peek should be performed. The peek request is then forwarded to peek/poke engine 410, which determines peek address(es) that data should be read from. In one embodiment, peek requests are used to read data from memory or registers found in controller 302. For example, registers storing parameters 422 in ports 418 may be peeked. The data request at the determined address(es) is then sent to appropriate registers. The data is then returned to peek/poke engine 410 and sent to the requesting node through PIN interface 400 and PIN 110.

In order to provide flow control, the requesting node waits for receipt of prior peek data before initiating a new peek request to the same memory.

When a poke request is received at PIN interface 400, PIN interface 400 determines that the request should be sent to peek/poke engine 410. In one embodiment, a poke request is sent in one or more data words and PIN interface 400 determines from the one or more data words that the request should be sent to peek/poke engine 410. Peek/poke engine 410 receives a poke address word from the requester and a poke data word to write to the address previously supplied by the poke address word. For example, registers including parameters 422 may have data written to them. Peek/poke engine 410 also determines from the one or more data words which register to write the data to.

After the data has been written, a poke acknowledgement may besent by peek/poke engine 410 to the requesting node through PIN 110 and PIN interface 400. Flow control can be realized by requiring a requesting node to wait for full acknowledgement before initiating a new poke to the same memory.

Fast track engine 412 is provided to perform memory access services that have a higher priority. Thus, fast track engine 412 allows requesting nodes to send requests and data in an expedited manner.

When a memory random access read or write is received at PIN interface 400, PIN interface 400 then provides the memory service request to random read/write engine 414. In one embodiment, a double word (32-bits) on a double word boundary may be read at a certain specified address or a burst read, which reads 16 double words on double word boundaries, may be performed.

In one embodiment, MRA read requests are placed in a queue and random read/write engine 414 services requests in a first in/first out methodology in one embodiment. When a request to memory 304 is ready, random read/write engine 414 sends the determined address with an indication of the appropriate memory that data should be read from to memory interface 404. The request is forwarded to memory 304 and data is read and returned to random read/write engine 414. The data can then be returned to the requesting node through PIN interface 400 and PIN 110.

In order to maintain flow control, in one embodiment, the requesting node waits for receipt of prior MIRA read data before initiating a new MRA read or write to the same memory. Thus, the requesting node may make a first read request to SDRAM memory 406 and a second request to flash memory 408 simultaneously but cannot make multiple requests to SRAM memory 406 or flash memory 408.

When PIN 400 receives a MRA write request, it determines from one or more data words in the request that a MRA write should be performed. For example, a bit or any other indication may be set in the one or more data words to indicate the request is a MRA request. The request is then forwarded to random read/write engine 414, which determines a memory location from the one or more data words where the data should be written. The address is then stored in a table and when data for the write is received (either with the one or more data words containing the request or in one or more data words received later), the data is then stored in a temporary buffer. The MRA request is then placed in a queue. The queue is serviced in a first in/first out manner by random read/write engine 414.

When the MRA write request is serviced, the data is retrieved from the temporary buffer and written to the address included in the appropriate entry of the random address queue. In this case, the data, address, and which memory to write the data are sent to memory interface 404, which writes the data to either SDRAM memory 406 or flash memory 408 at the address specified. Random read/write engine 414 then sends a MRA write acknowledgement to the requesting node. Flow control is maintained because a requesting node waits for a MRA write acknowledgement before issuing a new random MRA read or write to the same memory.

A plurality of ports 418 are provided for the direct memory access (DMA), point-to-point (PTP), and real-time input (RTI) memory services. In one embodiment, each port includes DAG parameters and other parameters 422 and a temporary buffer 424. In a preferred embodiment the DAG is used to generate sequences of addresses for both reading and writing memory. For example, a node that desires to access a pattern of memory locations obtains the addresses from the DAG. The DAG can be configured in various ways such as, e.g., by a control node poking port configuration parameters. Another way to configure the DAG is dynamically via PTP control words. Details of the DAG are provided in following sections.

One or more DAG parameters 422 associated with a port 148 are used by DAG 420 to determine the appropriate data to retrieve from memory 304, or the appropriate location in memory to update. Other parameters can be included, such as temporary buffer parameters, control and status register bits, producer information, consumer information, counts, and the like.

In one embodiment, each of ports 418 include a temporary buffer 424. Temporary buffer 424 is used to store one or more PTP/DMA/RTI words that are received from a requesting node. When data is stored in temporary buffer 424, an indication of what kind of request associated with the stored data is stored in queue 426.

A PTP_DMA_Queue 426 is maintained by the PTP/DMA/RTI engine 416 for servicing of ports. Various events as described below cause a port to be placed on this first-in-first-out queue.

The services provided by PTP/DMA/RTI engine 416 will now be described.

Direct memory access services include a DMA read and a DMA write service. In a DMA read service, any of the ports 418 can serve as a source of a DMA channel set up by a requesting node 301. When a DMA read request for a port i in ports 418 is serviced, DAG 420 is configured with the DAG parameters for port i. Data is then read from memory 304, such as SDRAM memory 406 or flash memory 408, using the just configured DAG 420 by PTP/DMA/RTI engine 416.

The DMA read may be for a large chunk of data and multiple reads may be needed to read the entire requested chunk of data. Thus, memory controller 302 may send multiple chunks of data to a requesting node 301 in response to a DMA read. In one embodiment, counts are used to determine how much data to read. For example, chunks of data may be read in 32-bit words but the read request may be for seven bytes. The count would be set to seven and when the first word, which includes four bytes, is read, the count is decremented to three. When the next byte is read, the count is decremented to zero and only three bytes are read because the count was three. In some cases, multiple DMA reads may be serviced for a node.

In order to maintain flow control, memory controller 302 waits for a DMA read chunk acknowledgment from the requesting node before transmitting the next chunk of data. Also, PTP/DMA/RTI engine 416 waits for a DMA done message from the requesting node until a new DMA read from the same memory 304, such as SDRAM memory 406 or flash memory 408, is initiated.

PTP/DMA/RTI engine 416 can also perform a DMA write. Any of the ports in ports 418 may serve as the destination of a DMA channel set up by a requesting node. Temporary buffer 424 is provided in each of ports 418 in order to store incoming DMA data that is eventually written into memory 304. Although buffer 424 is described, it will be understood that buffer 424 may not be used and the data may be streamed to PTP/DMA/RTI engine 416. Because a DMA write might be a write for large amounts of data, the data may arrive in multiple data words over a period of time. When a DMA write request is received at a port i in ports 418, if port i's temporary buffers 424 are already full, an error message is sent to the requesting node. If not, the data is written sequentially into port i's temporary buffer 424 and a corresponding DMA write request is placed in queue 426. As more data is received on port i, the data is written sequentially into the port's temporary buffer 424 if it is not already full. When the last data word for the DMA write request is received on port i, a DMA write request is placed in queue 426. Although the above sequence is described, it will be understood that a person skilled in the art will appreciate other ways of handling the received data.

When the DMA write request is ready to be serviced by PTP/DMA/RTI engine 416, DAG 420 of PTP/DMA/RTI engine 416 is configured with DAG parameters 422 for port i. Each successive DMA write request is read from queue 426 and the corresponding data in port i's temporary buffer 424 is then written to memory 304, such as SDRAM memory 406 or flash memory 408, using the just configured DAG 420. DAG 420 may calculate addresses based on one or more parameters 422 associated with port I and an address associated with the applicable memory DMA request. The addresses may be calculated for each successive DMA write request and DAG 420 may be configured with parameters 422 for each write request.

In order to maintain flow control, the transmitting node waits for a chunk acknowledgment from memory controller 302 that indicates the chunk of data has been stored in temporary buffer 424 before transmitting the next chunk of data to be stored in port l's temporary buffer 424. Additionally, the requesting node waits for a DMA done message from memory controller 302 before initiating a new DMA write to the same memory 304.

In one embodiment, counts are used to determine how much data to write. For example, chunks of data may be received in 32-bit words. The write request may be for seven bytes. The count would be set to seven and when the first word, which includes four bytes, is received and written, the count is decremented to three. When the next word is received, the count is decremented to zero and only three bytes are written because the count was three.

Point-to-point memory services may also be performed by PTP/DMA/RTI engine 416. Nodes 301 may read and write memory 304 and update selected port parameters 422 via any of ports 418 using a point-to-point protocol. Memory controller 302 adheres to all point-to-point conventions, performs forward and backward ACKing, and also maintains counts for consumers and producers. Additionally, flow control is maintained because of the point-to-point conventions. For example, in a write request, neither temporary buffer 424 for ports 418 nor a buffer in memory 304 will overflow so long as the requesting node adheres to PTP conventions. Additionally, in a read request, memory controller 302 will not overflow the consuming node's input buffer as long as the requesting node adheres to PTP conventions.

PTP/DMA/RTI engine 416 may perform point-to-point memory services using a number of modes. For example, an auto-source mode provides an infinite source of data, A read occurs automatically when there is available space in a consuming node's input buffer and read requests are not used. An infinite-sink mode may be provided to provide an infinite sink for data. In this case, a write occurs when there is data in temporary buffer 424 and new data overwrites old data when the main buffer is full. In one embodiment, memory 304 includes a main buffer where data is written to. Thus, data is read from temporary buffer 424 and written to the main buffer. Although a main buffer is described, it will be understood that data may be written to other structures in memory 304. A finite-sink mode provides a finite sink for data. In this case, a write occurs when there is data in temporary buffer 424 and available space in the main buffer and writing stops when the main buffer is full. A buffer mode implements a first in/first out (FIFO) queue. In this case, writes fill the main buffer while reads drain the main buffer. A write occurs when there is data in the temporary buffer and available space in the main buffer. A read occurs when there is sufficient data in the main buffer and available space in the consuming-nodes input buffer. A basic mode provides unrestricted writing to a data structure. In this case, a write occurs when there is data in the temporary buffer, and old data in memory is overwritten. Also, the basic mode provides unrestricted reading of a data structure. A read occurs after an explicit read request is received and there is available space in the consuming nodes input buffer.

Figure 5:
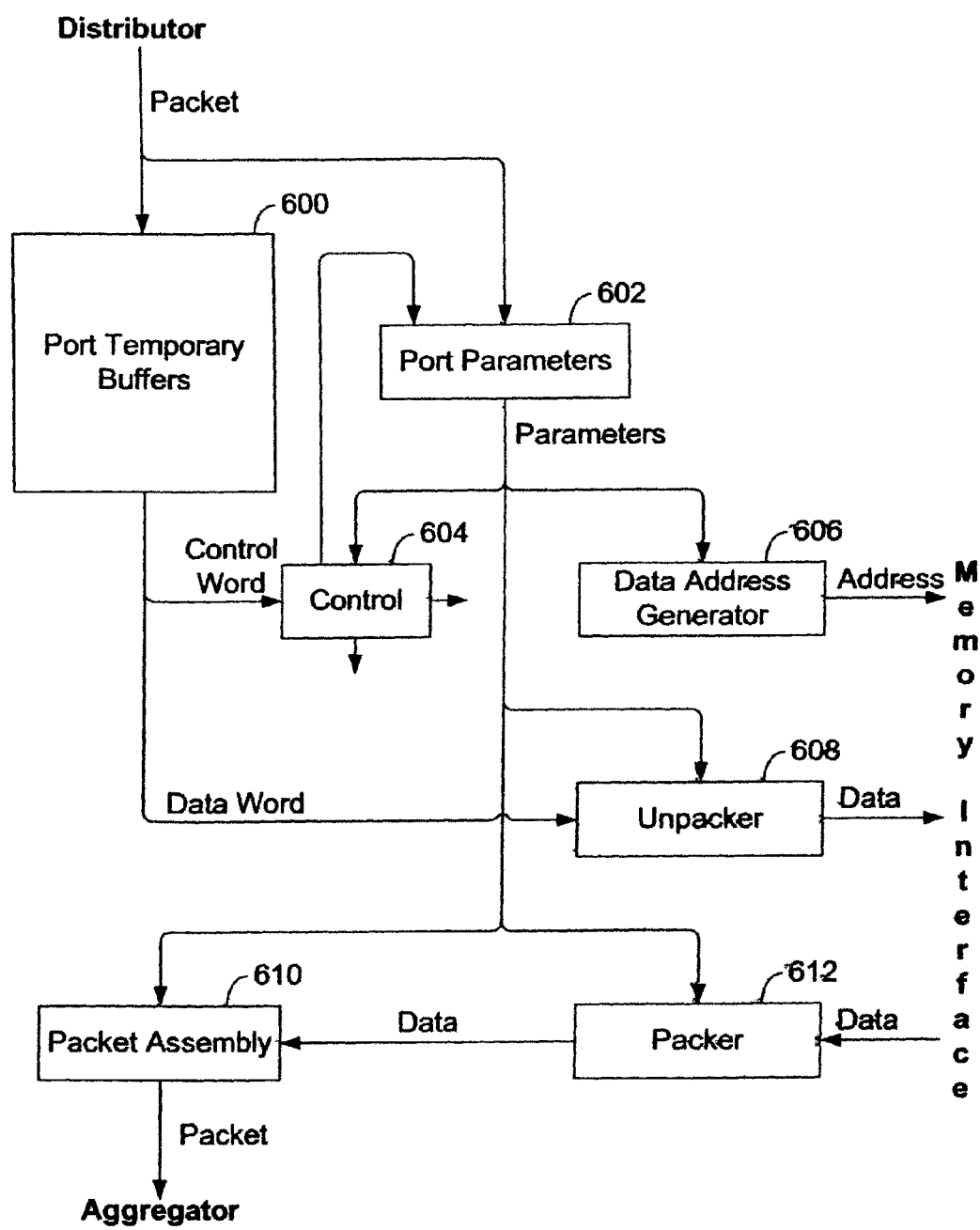
FIG. 5 illustrates an embodiment of a point-to-point (PTP) engine usable to perform PTP memory services according to the present invention.

FIG. 5 illustrates the general design of an engine such as PTP/DMA/RTI engine 416 of FIG. 4.

Data packets are received from a data source such as a distributor (e.g., from PIN Interface 400 of FIG. 4). The payload portion of each incoming packet together with a bit indicating whether the payload is a data word or control word is stored in port temporary buffer 600. In a preferred embodiment, packets are 51 bits wide and can include destination information, control information, parameter information, data, or a combination of these types of information. When a port is serviced, control words and data words are read from port temporary buffer 600 and sent to control system 604 or unpacker 608, respectively.

Port parameters can be updated by information in "poke packets" or by control-word information in incoming PTP/DMA packets. The parameter update information is provided to parameter control system 602. Port parameters are used to define characteristics of a port for specific or desired functionality. For example, port parameters control characteristics of temporary buffers, removing control and data words from the temporary buffer for processing, unpacking data (double) words into records in preparation for writing to main memory, writing and reading records to main memory, packing records read from memory into double-words and composing appropriate MIN words for transmission to the consumer node, sending various control words—forward and backward acknowledgements, DMA chunk acknowledgements and DMA Done messages—to the producer and consumer nodes; and other functions.

Unpacked data produced by unpacker 608 can include one or more records. Each record can be 8, 16 or 32 bits. A 4-bit byte select is sent with each 32-bit unpacked datum to indicate which of the bytes contain valid data and are to be written to memory.

Control words are used to specify parameters and other control information and are discussed in detail in the sections, below. For example, a control word can include information that indicates whether a parameter update is to be followed by a read using the updated port parameters.

Data address generator 606 is used to generate an address, or addresses, for use in reading from or writing to memory. The data address generator is configured by the DAG parameters included in the port parameters 602. Packer 612 is used to pack records received from memory into 32-bit data words for transmission to the consuming node. Packet assembly 610 is used to assemble the 32-bit data words into a standard PTP, DMA or RTI packets for transmission to the consuming node.

In a preferred embodiment, the XMC node adheres to the same network protocol conventions as other nodes in the ACE. Examples of ACE network protocols in the preferred embodiment include Peek/Poke, MRA, PTP, DMA, RTI, message, etc. This allows XMC nodes to benefit from the same scaling features and adaptable architecture of the overall system. Details of a network protocol used in the preferred embodiment can be found in the related patent application entitled "Uniform Interface for a Functional Node in an Adaptive Computing Engine," referenced above.

In a preferred embodiment of the XMC there are 64 ports—each one a combination input/output port. Three matrix interconnect network (MIN) (also referred to as the programmable interconnect network (PIN)) protocols—Direct-Memory-Access (DMA), Point-To-Point (PTP) and Real-Time-Input (RTI)—make use of these ports for both writing data to and reading data from memory.

Memory addresses for both writing and reading are generated by a logical DAG associated with each port. This logical DAG is actually a set of DAG parameters that are used to configure a single physical DAG, as needed, for memory writes and reads.

Packing records read from memory into double-words and composing appropriate MIN words for transmission to the consumer node; and Sending various control words—forward and backward acknowledgements, DMA chunk acknowledgements and DMA Done messages—to the producer and consumer nodes.

The value of each port parameter can be either static or dynamic. If static, then the parameter is updated only by a poke from the K-Node. If dynamic, then the parameter can be updated by a poke from the K-Node and also during normal XMC operation.

The Control and Status Bits described in Table A are the parameters that direct the behavior of ports and define their mode of operation.

TABLE A

Control and Status Bit parameters

| Parameter | Description |
| --- | --- |
| Port_Enabled (Static Value) | 0: Port disabled<br>1: Port enabled |
| Port_Type[1:0] (Static Value) | 00: PTP<br>01: PTP_Packet_Mode<br>10: RTI<br>11: DMA |
| Record_Size[1:0] (Static Value) | 00: Byte (8-bit)<br>01: Word (16-bit)<br>10: Double-Word (32-bit) |
| DAG_Address_Mode[1:0] (Static Value) | 00: 1-D<br>01: 2-D<br>10: Bit_Reverse |
| Auto_Read (Static Value) | 0: Port does not support automatic reads<br>1: Producer/Consumer counts can automatically trigger a read<br>0: Consumer_Count not checked in auto read |
| Buffer_Read (Static Value) | 0: Consumer_Count not checked in auto read<br>1: Consumer_Count >= 0 for auto read |
| Buffer_Write (Static Value) | 0: New data overwrites old data in memory<br>1: No writes to main-memory buffer when full |
| Update_Index (Static Value) | 0: Update DAG_X_Index and DAG_Y_Index only by way of poke<br>1: Update DAG_X_Index and DAG_Y_Index after each DAG use |
| New_MIN_Word_On_YWrap (Static Value) | 0: Ignore DAG_Y_Index wrap when unpacking/packing MIN words<br>1: Start unpacking/packing new MIN word when DAG_Y_Index wraps |
| High_Speed_Write (Static Value) | 0: Normal mode-port handles all incoming words<br>1: High-speed mode-port does not support read requests |
| Burst (Static Value) | 0: Normal DAG-addressing mode<br>1: High-throughput mode for accessing contiguous blocks of 2-D data |
| Random_Access (Static Value) | 0: Normal DAG addressing when performing read request<br>1: DAG addressing bypassed when performing read request |

Each port also has a temporary buffer to temporarily store incoming PTP/RTI/DMA words from the MIN. The total size of all 64 temporary buffers is 16 Kbytes arranged as 4K×33 bit words. The 33rd bit of each word indicates whether a double-word is a data word or a control word, as described below.

Each XMC port is associated with a set of parameters that define the characteristics of that port. These parameters configure the XMC hardware when a port is called upon to perform one of the following tasks:

Writing incoming control and data words into the temporary buffer;

Removing control and data words from the temporary buffer for processing;

Unpacking data (double-) words into records in preparation for writing to main memory;

Writing records to main memory;

Reading records from main memory;

The two DMA Bits in Table B are used to control DMA transfers from and to the XMC respectively.

TABLE B

DMA Bits

| Parameter | Description |
| --- | --- |
| DMA_Go (Static Value) | Poking this bit with a 1 initiates a DMA transfer from the XMC to Consumer |
| DMA_Write_Last_Word (Dynamic Value) | 0: DMA_Write_Last_Word_Of_Chunk initiated DMA service request<br>1: DMA_Write_Last_Word initiated DMA service request |

The DAG parameters in Table C—together with DAG_Address_Mode—determine the sequence of addresses generated by the port's Data Address Generator. See section 3.2 for more details.

TABLE C

DAG Parameters

| | |
|---|---|
| DAG_Origin[27:0]<br>(Dynamic Value) | Unsigned integer; Units = bytes; Base address of block<br>1-D mode read:<br>    DAG Address = DAG_Origin + DAG_X_Index<br>1-D mode write:<br>    DAG Address = DAG_Origin + DAG_Y_Index<br>2-D mode:<br>    DAG Address = DAG_Origin + DAG_X_Index + DAG_Y_Index<br>Bit_Reverse mode read or write:<br>    DAG Address = DAG_Origin + reverse(DAG_X_Index)†<br>    Must be on a Dword boundary, i.e. [1:0] = 00;<br>†reverse(b, p0, p1) - reverse bits from bitpos p0 thru bitpos p1, e.g.:<br>    for (i = 0; i <=(p1-p0-1)/2; i++) { swap(b[p0+i], b[p1-i]); } |
| DAG_X_Index[27:0]<br>(Dynamic Value) | Unsigned integer; Units = bytes<br>Initial value must be less than DAG_X_Limit.<br>1-D mode, after a read, or<br>2-D mode, after a read or write:<br>    DAG_X_Index += DAG_X_Stride<br>Bit_Reverse mode, after a read or write:<br>    DAG_X_Index += 1, 2, or 4 (byte, word, dword record, respectively)<br>Then test:<br>    if DAG_X_Index ≧ DAG_X_Limit (+X Wrap)<br>        DAG_X_Index -= DAG_X_Limit<br>    else if DAG_X_Index < 0 (-X Wrap)<br>        DAG_X_Index += DAG_X_Limit |
| DAG_X_Stride[27:0]<br>(Dynamic Value) | Signed integer; Units = bytes<br>Absolute value must be less than DAG_X_Limit.<br>1-D, 2-D mode: Increment/decrement to DAG_X_Index<br>Bit_Reverse mode: reverse(1) = 2^(n − 1), i.e. a single bit marking the<br>leftmost bit position to be reversed in DAG_X_Index |
| DAG_X_Limit [27:0]<br>(Dynamic Value) | Unsigned integer; Units = bytes<br>1-D mode read - block size<br>1-D mode write - not used<br>2-D mode read or write - X block size<br>Bit_Reverse mode - block size |
| DAG_Y_Index[27:0]<br>(Dynamic Value) | Unsigned integer; Units = bytes<br>Initial value must be less than DAG_Y_Limit.<br>1-D mode, after a write, or<br>2-D mode, after an X Wrap:<br>    DAG_Y_Index += DAG_Y_Stride<br>Bit_Reverse mode - not used<br>Then test:<br>    if DAG_Y_Index ≧ DAG_Y_Limit (+Y Wrap)<br>        DAG_Y_Index -= DAG_Y_Limit<br>    else if DAG_Y_Index < 0 (-Y Wrap)<br>        DAG_Y_Index += DAG_Y_Limit |
| DAG_Y_Stride[27:0]<br>(Dynamic Value) | Signed integer; Units = bytes<br>Absolute value must be less than DAG_Y_Limit<br>1-D, 2-D mode: Increment/decrement to DAG_Y_Index<br>Bit_Reverse mode - not used |
| DAG_Y_Limit[27:0]<br>(Dynamic Value) | Unsigned integer; Units = bytes<br>1-D mode read - not used<br>1-D mode write - block size<br>2-D mode read or write - Y block size<br>Bit_Reverse mode - not used |

The Temporary-Buffer Parameters in Table D define the size of temporary buffer of a port and provide the write-pointer and read-pointer needed to implement a circular first-in-first-out queue.

TABLE D

Temporary-Buffer Parameters

| Parameter | Description |
|---|---|
| Buffer_Size[3:0]<br>(Static Value) | 0000: 4 (bytes)<br>0001: 8<br>0010: 16<br>0011: 32<br>0100: 64<br>0101: 128<br>0110: 256<br>0111: 512 |

TABLE D-continued

Temporary-Buffer Parameters

| Parameter | Description |
|---|---|
| | 1000: 1024<br>1001: 2048<br>1010: 4096<br>1011: 8192<br>1100: 16384 |
| Write_Address[11:0]<br>(Dynamic Value) | Write pointer |
| Read_Address[11:0]<br>(Dynamic Value) | Read pointer |

The Producer/Consumer Information in Table E is used in various fields in the MIN words that are sent to the Data Producer, Control Producer and Consumer.

TABLE E

Producer/Consumer Information

| Parameter | Description |
|---|---|
| Data_Producer_ID[7:0] (Static Value) | Address of Data Producer (The source of PTP/DMA data words) |
| Data_Producer_Mode (Static Value) | Mode bit of Data Producer |
| Data_Producer_Port[5:0] (Static Value) | Port number of Data Producer |
| Data_Producer_Task[4:0] (Static Value) | Task number of Data Producer |
| Control_Producer_ID[7:0] (Static Value) | Address of Control Producer (The source of PTP control words) |
| Control_Producer_Mode (Static Value) | Mode bit of Control Producer |
| Control_Producer_Port[5:0] (Static Value) | Port number of Control Producer |
| Control_Producer_Task[4:0] (Static Value) | Task number of Control Producer |
| Consumer_ID[7:0] (Static Value) | Address of Consumer (The destination of read data) |
| Consumer_Mode (Static Value) | Mode bit of Consumer |
| Consumer_Port[5:0] (Static Value) | Port number of Consumer |
| Consumer_Task[4:0] (Static Value) | Task number of Consumer |

The Counts in Table F provide flow control between (a) the Data and Control Producers and the XMC, (b) the temporary buffer and the main-memory buffer (when Buffer_Write=1) and (c) the XMC and the Consumer.

TABLE F

Counts

| Parameter | Description |
|---|---|
| ACK_Count[13:0] (Dynamic Value) | A signed number indicating the number of bytes in a port's temporary buffer minus 1; A port is serviced when ACK_Count $\geq$ 0. Initialized at system reset to −1 indicating that the temporary buffer is empty; and then incremented in response to forward ACKs from the Data and Control Producers indicating the number of data/control words, expressed in bytes, placed in the temporary buffer; and then decremented when the XMC sends backward ACKs to the Data Producer and Control Producer indicating the number of data words and control words, respectively - expressed in bytes - removed from the temporary buffer |
| Read_Count[13:0] (Static Value) | An unsigned number indicating the number of records read from memory and sent to the consumer node per read-request or auto-read |
| Producer_Count[13:0] (Dynamic Value) | A signed number reflecting the available space, in bytes, in the Consumer's input-buffer; Producer_Count < 0 indicates that the consumer node input-buffer has available space for Read_Count records. Should be initialized to RC − CBS − 1 (a negative value), where RC is Read_Count, expressed in bytes, and CBS is the Consumer's input-buffer size, in bytes; Incremented when the XMC sends forward ACKs to the Consumer indicating the amount of data, in bytes, read from memory and sent to the Consumer; and then decremented in response to backward ACKs from the Consumer indicating the amount of space, in bytes, freed up in the Consumer's input buffer |
| Consumer_Count[27:0] (Dynamic Value) | A signed number reflecting the number of bytes in the main-memory buffer; Consumer_Count $\geq$ 0 indicates that the main-memory buffer has at least Read_Count records; Applicable only when Buffer_Read = 1. Should be initialized to a (negative) value between TBS − MBS and −RC, where TBS is the temporary-buffer size, in bytes, MBS is the main-memory-buffer size, in bytes, and RC is Read_Count, expressed in bytes; Incremented when the XMC moves data from the temporary buffer to the main-memory buffer; and then decremented when the XMC sends forward ACKs to the Consumer indicating the amount of data, in bytes, read from the main-memory buffer and sent to the Consumer |
| Buffer_Full_Offset[27:0] (Static Value) | A signed number which, when added to Consumer_Count, indicates XMC buffer status; Consumer_Count + Buffer_Full_Offset $\geq$ 0 indicates that the main-memory buffer is full; The main-memory buffer is considered to be full when it does not have at least a temporary-buffer's worth of available space; Applicable only when Buffer_Write = 1. Should be initialized to TBS − MBS − ICC − 1 where TBS is the temporary-buffer size, in bytes, MBS is the main-memory-buffer size, in bytes, and ICC is the initial value of Consumer_Count |

Table C, above, describes XMC DAG parameters. The 3 accessing modes (1-D, 2-D, and Bit_Reverse) are explained below. Special cases are also discussed relating to Y-Wrap and Burst Mode.

The DAG includes the ability to generate patterned addresses to memory. Three parameters—Index, Stride, and Limit—in each of X and Y define these patterns. In the simplest 1-dimensional case, the Index parameter is incremented by Stride, tested against the block size given by Limit, and then added to Origin to determine the final address.

Note that Stride is a signed quantity, and can be negative to enable stepping backwards through a block of memory addresses. If the Index is incremented/decremented outside the block (0 thru Limit-1), the Limit is subtracted/added respectively to bring the address back within the block. In this way, circular buffers with automatic wrap-around addressing are easily implemented. In general, any type of addressing, address incrementing/decrementing, indexing, etc., can be used with DAGs of different designs.

In a 1-D addressing mode, the DAG writes or reads addresses in a linear fashion. On each advance, DAG_X_Stride is added to DAG_X_Index, and the result tested greater than or equal to DAG_X_Limit and less than 0 (since DAG_X_Stride can be negative). In these cases, DAG_X_Index is decremented or incremented, respectively, by DAG_X_Limit, thus restoring it to the proper range.

When in 1-D Write Mode, only, the DAG uses the DAG_Y_Index, DAG_Y_Stride, and DAG_Y_Limit parameters, not X, to compute the write address. This is so that read operations can be performed concurrently, using the X parameters in the usual way, to create a circular buffer such as a FIFO.

In a 2-D addressing mode, the DAG writes or reads addresses in 2-dimensional "scan-line" order, utilizing both the X and Y parameters similarly to the 1-D mode. X advance is performed first, and an X Wrap (either +or −) causes a Y advance (and thus a potential Y Wrap as well). See the DAG advance pseudo-code description in section 3.2.4 below.

Note that Y parameters are always specified in units of bytes, not scan lines or data items.

Bit-reversed addressing is included in the hardware to enable implementation of Fast Fourier Transforms and other interleaved or "butterfly" computations. In this mode, bits within the DAG_X_Index field are reversed (swapped) just prior to using them in the memory address computation.

In Bit_Reverse mode, DAG_X_Stride is not used as an increment, but instead determines the range of bits to reverse within DAG_X_Index. Specifically, the DAG_X_Stride should be set to reverse(1)=$2^{(n-1)}$=½ the size of the block in bytes. Bits p through n−1 will be reversed in the DAG_X_Index, where p=0, 1, 2 for Record_Size of byte, word, and dword, respectively.

Example: For a $2^{12}$=4096-point FFT in byte mode, parameters might be

DAG_X_Index=0x0, DAG_X_Stride=0x800, DAG_X_Limit=0x1000.

Thus the hardware will reverse bits 0-11, and the address sequence is

| address | reverse(address, 0, 11) |
|---|---|
| 0 | 0x000 |
| 1 | 0x800 |
| 2 | 0x400 |
| 3 | 0xc00 |
| 4 | 0x200 |
| 5 | 0xa00 |
| ... | ... |

As in other modes, the resulting reversed DAG_X_Index value is added to the Origin address before being used to access memory.

In Bit_Reverse mode, note that the starting DAG_X_Index, the DAG_X_Limit, and the Origin are byte addresses specified normally—NOT bit-reversed. However, in this mode, the Origin must be on a double-word boundary, i.e. bits [1:0]=00;

Although the X Wrap mechanism works in Bit_Reverse mode, typically DAG_X_Index is initialized to 0 and a single array of $2^n$ values will be addressed once.

Combining the above parameter definitions, the calculation of the DAG memory addresses is as follows:

When the DAG is advanced:

```
If Address_Mode = 1-D and the DAG is generating a Read Address [or
Bit_Reverse mode]:
    DAG_X_Index = DAG_X_Index + DAG_X_Stride [+1, 2,
    or 4 instead if Bit_Reverse mode]
    If DAG_X_Index >= DAG_X_Limit, (+X wrap)
        DAG_X_Index = DAG_X_Index − DAG_X_Limit;
    Else if DAG_X_Index < 0, (−X wrap)
        DAG_X_Index = DAG_X_Index + DAG_X_Limit;
    Memory Address = Origin + DAG_X_Index
    [+reverse(DAG_X_Index) instead if Bit_Reverse mode]
If Address_Mode = 1-D and the DAG is generating a Write Address:
    DAG_Y_Index = DAG_Y_Index + DAG_Y_Stride
    If DAG_Y_Index >= DAG_Y_Limit, (+Y wrap)
        DAG_Y_Index = DAG_Y_Index − DAG_Y_Limit;
    Else if DAG_Y_Index < 0, (−Y wrap)
        DAG_Y_Index = DAG_Y_Index + DAG_Y_Limit;
    Memory Address = Origin + DAG_Y_Index;
If Address_Mode = 2-D:
    DAG_X_Index = DAG_X_Index + DAG_X_Stride;
    If DAG_X_Index >= DAG_X_Limit, (+X wrap)
        DAG_X_Index = DAG_X_Index − DAG_X_Limit;
        DAG_Y_Index = DAG_Y_Index + DAG_Y_Stride;
        If DAG_Y_Index >= DAG_Y_Limit, (+Y wrap)
            DAG_Y_Index = DAG_Y_Index − DAG_Y_Limit;
        Else if DAG_Y_Index < 0, (−Y wrap)
            DAG_Y_Index = DAG_Y_Index + DAG_Y_Limit;
    Else if DAG_X_Index < 0, (−X wrap)
        DAG_X_Index = DAG_X_Index + DAG_X_Limit;
        DAG_Y_Index = DAG_Y_Index + DAG_Y_Stride;
        If DAG_Y_Index >= DAG_Y_Limit, (+Y wrap)
            DAG_Y_Index = DAG_Y_Index − DAG_Y_Limit;
        Else if DAG_Y_Index < 0, (−Y wrap)
            DAG_Y_Index = DAG_Y_Index + DAG_Y_Limit;
    Memory Address = Origin + DAG_X_Index + DAG_Y_Index
```

Tables G-N, below, shows "for loop" representations in C pseudo-code of various DAG addressing modes. Capitalized names such as Origin, Index, Stride, Limit, etc. represent the corresponding DAG parameters. The examples below all assume Record_Size=Dword=4 bytes, and positive strides. Note that DAG parameters are always given in units of bytes, not records.

TABLE G

Linear Addressing Definition

```
// Linear addressing
void DAG_Linear (         byte *Origin,
```

TABLE G-continued

Linear Addressing Definition

```
                uint28 Index,
                int28 Stride,
                uint28 Limit,
                int28 count) {        // count < Limit
    int28 i;
    for (i=Index; i<Index+count; i+=Stride) {
        printf("%d: %d %d\n", i, Origin+i, (dword)Origin[i]);
    }
}
```

TABLE H

Linear Addressing Example

Given the following memory contents,

| address  | contents |
|----------|----------|
| 0x22bee8 | 7 |
| 0x22bee4 | 6 |
| 0x22bee0 | 5 |
| 0x22bedc | 4 |
| 0x22bed8 | 3 |
| 0x22bed4 | 2 |
| 0x22bed0 | 1 |
| 0x22becc | 0 | the function call
DAG_Linear(0x22bed0, 0, 1*4, 20*4, 6);
yields

| iteration | address  | contents |
|-----------|----------|----------|
| 0:        | 0x22bed0 | 1 |
| 1:        | 0x22bed4 | 2 |
| 2:        | 0x22bed8 | 3 |
| 3:        | 0x22bedc | 4 |
| 4:        | 0x22bee0 | 5 |
| 5:        | 0x22bee4 | 6. |

TABLE I

Circular Addressing Definition

```
// Circular (wraparound) addressing
void DAG_Circular_1D(   byte *Origin,
                        uint28 Index,
                        int28 Stride,
                        uint28 Limit,
                        int28 count) {
    int28 i, imod;
    for (i=Index; i<Index+count; i+=Stride) {
        imod = i % Limit;
        printf("%d: %d %d\n", i, Origin+imod, (dword)Origin[imod]);
    }
}
```

TABLE J

Circular Addressing Example

Given the following memory contents,

| address  | contents |
|----------|----------|
| 0x22bee8 | 7 |
| 0x22bee4 | 6 |
| 0x22bee0 | 5 |
| 0x22bedc | 4 |

TABLE J-continued

Circular Addressing Example

| address  | contents |
|----------|----------|
| 0x22bed8 | 3 |
| 0x22bed4 | 2 |
| 0x22bed0 | 1 |
| 0x22becc | 0 | the function call
DAG_Circular_1D(0x22bed0, 0, 1*4, 6*4, 10);
yields

| iteration | address  | contents |
|-----------|----------|----------|
| 0:        | 0x22bed0 | 1 |
| 1:        | 0x22bed4 | 2 |
| 2:        | 0x22bed8 | 3 |
| 3:        | 0x22bedc | 4 |
| 4:        | 0x22bee0 | 5 |
| 5:        | 0x22bee4 | 6 |
| 6:        | 0x22bed0 | 1 |
| 7:        | 0x22bed4 | 2 |
| 8:        | 0x22bed8 | 3 |
| 9:        | 0x22bee0 | 4. |

TABLE K

2D Addressing Definition

```
// 2-D Addressing
void DAG_2D(    byte *Origin,
                uint28 xIndex,
                int28 xStride,
                uint28 xLimit,
                uint28 yIndex,
                int28 yStride,
                uint28 yLimit) {
    int28 x, y;
    // Access a one-dimensional array through two loops (2-D)
    for (y=yIndex; y<yIndex+yLimit; y+=yStride) {
        for (x=xIndex; x<xIndex+xLimit; x+=xStride) {
            printf("%d %d: $d %d\n", x, y, Origin+x+y, (dword)Origin[x+y]);
        }
    }
}
```

TABLE L

2D Addressing Example

Given the following memory contents
(a 2-D image, X × Y = 3 columns × 3 rows
embedded in 5 columns × 4 rows),

| address  | contents |
|----------|----------|
| 0x22bf18 | 9 |
| 0x22bf14 | 8 |
| 0x22bf10 | 7 |
| 0x22bf0c | 6 |
| 0x22bf08 | 5 |
| 0x22bf04 | 4 |
| 0x22bf00 | 3 |
| 0x22befc | 2 |
| 0x22bef8 | 1 |
| 0x22bef4 | 0 |
| 0x22bf40 | 19 |
| 0x22bf3c | 18 |
| 0x22bf38 | 17 |
| 0x22bf34 | 16 |
| 0x22bf30 | 15 |
| 0x22bf2c | 14 |
| 0x22bf28 | 13 |
| 0x22bf24 | 12 |
| 0x22bf20 | 11 |
| 0x22bf1c | 10 |

TABLE L-continued

2D Addressing Example the function call
DAG_2D(0x22bef8, 0, 1*4, 3*4, 0, 5*4, 15*4);
yields

| x | y | address | contents |
|---|---|---------|----------|
| 0 | 0: | 0x22bef8 | 1 |
| 4 | 0: | 0x22befc | 2 |
| 8 | 0: | 0x22bf00 | 3 |
| 0 | 20: | 0x22bf0c | 6 |
| 4 | 20: | 0x22bf10 | 7 |
| 8 | 20: | 0x22bf14 | 8 |
| 0 | 40: | 0x22bf20 | 11 |
| 4 | 40: | 0x22bf24 | 12 |
| 8 | 40: | 0x22bf28 | 13 |

TABLE M

Bit-Reverse Addressing Definition

```
// Bit-Reverse addressing (with wraparound)
void DAG_BitReverse( byte *Origin,
                     uint28 Index,
                     int28 Stride,
                     uint28 Limit,
                     int28 count) {
  int28 i, irev;
  for (i=Index; i<Index+count*4; i+=4)   {// inc by 4 for dwords
    irev = Bit_Rev(i % Limit);           // swap bits 2 thru Stride bit
    printf("%d: %d %d\n", i, Origin+irev, (dword)Origin[irev]);
  }
}
```

TABLE N

Bit-Reverse Addressing Example

Given the following memory contents (an 8-element block),

| address | contents |
|---------|----------|
| 0x22bef0 | 9 |
| 0x22beec | 8 |
| 0x22bee8 | 7 |
| 0x22bee4 | 6 |
| 0x22bee0 | 5 |
| 0x22bedc | 4 |
| 0x22bed8 | 3 |
| 0x22bed4 | 2 |
| 0x22bed0 | 1 |
| 0x22becc | 0 | the function call
DAG_BitReverse(0x22bed0, 0, 4*4, 8*4, 12);
// Stride = 2^(n−1) = 4 yields

| iteration | address | contents |
|-----------|---------|----------|
| 0: | 0x22bed0 | 1 |
| 4: | 0x22bee0 | 5 |
| 8: | 0x22bed8 | 3 |
| 12: | 0x22bee8 | 7 |
| 16: | 0x22bed4 | 2 |
| 20: | 0x22bee4 | 6 |
| 24: | 0x22bedc | 4 |
| 28: | 0x22beec | 8 |
| 32: | 0x22bed0 | 1 |
| 36: | 0x22bee0 | 5 |
| 40: | 0x22bed8 | 3 |
| 44: | 0x22bee8 | 7. |

Any of the 64 PTP/DMA ports can serve as the source of a DMA channel set up by the K-Node/Host. In a preferred embodiment, only one DMA channel to/from memory at a time can be supported.

Actions

When Status_Register[i].DMA_Go is poked with a 1,
1) Place a Service Request for Port i in the PTP_DMA_Queue if one is not already pending When a Service Request for Port i is serviced with Control_Register[i].Port_Type=DMA and Register[i].DMA_Go=1:
1) Pop Port i from the PTP_DMA_Queue
2) If Status_Register[i].Port_Enabled=0
   a) Send a Port Disable Acknowledgement to the K-Node
   b) Terminate servicing of Port i
3) Load Port-i DAG parameters into corresponding DAG registers
4) Note: When DAG_Address_Mode[i]=1-D, the DAG uses the three X registers for reading and the three Y registers for writing
5) Read Read_Count[i] records from main memory under DAG direction, pack them from right to leftt into double-words and send to Consumer[i] via a sequence of DMA Read Data's followed by a single DMA Read Last Word.

Flow Control

The K-Node waits for a DMA Done message from the destination node before initiating a new DMA read/write from/to the same memory.

DIRECT-MEMORY-ACCESS WRITE

Any of the PTP/DMA 64 ports can serve as the destination of a DMA channel set up by the K-Node/Host.

Actions

When a DMA Write from the MIN is received on Port i:
1) Place the 32-bit payload, together with a bit indicating that the double-word is a data word, sequentially into Port i's (33-bit-wide, circular) temporary buffer.
2) Increment Ack_Count[i] by 4.

When a DMA Write Last Word Of Chunk from the MN is received on Port i:
1) Perform DMA Write actions.
2) Set Status_Register[i].DMA_Write_Last_Word to 0.
3) Place a Service Request for Port i in the PTP_DMA_Queue if one is not already pending.

When a DMA Write Last Word from the MIN is received on Port i:
1) Perform DMA Write actions.
2) Set Status_Register[i].DMA_Write_Last_Word to 1.
3) Place a Service Request for Port i in the PTP_DMA_Queue if one is not already pending.

When a Service Request for DMA-Port i is serviced
1) Pop Port i from the PTP_DMA_Queue
2) If Status_Register[i].Port_Enabled=0
   a) Send a Port Disable Acknowledgement to the K-Node
   b) Terminate servicing of Port i
3) Load Port-i DAG parameters into corresponding DAG registers
4) Note: When DAG_Address_Mode[i]=1-D, the DAG uses the three X registers for reading and the three Y registers for writing
5) Initialize signed-integer C to Ack_Count[i]/4
6) While C>=0:
   a) Decrement C by 1
   b) Remove double-word from temporary buffer
   c) Unpack double-word from right to left[†] and write records to memory under DAG direction.

[†]Records are packed and unpacked from right to left because the XMC is little endian.

7) Decrement Ack_Count[i] by 4 times the total number of double-words removed from Port i's temporary buffer
8) If Status_Register[i].DMA_Write_Last_Word=0, send a DMA Chunk Acknowledgement to Data_Producer[i]; Omit if no records were written to memory
9) Else if Status_Register[i].DMA_Write_Last_Word=1, send a DMA Done message to the K-Node; Omit if no records were written to memory
10) If Update_Index[i]=1:
   a) Update X_Index[i] DAG parameter with X_Index DAG register
   b) Update Y_Index[i] DAG parameter with Y_Index DAG register The DMA source waits for a DMA Chunk Acknowledgement from the memory controller before transmitting the next chunk (chunk size must be less than or equal to the size of the port's temporary buffer).

The K-Node waits for DMA Done message from the memory controller before initiating a new DMA read/write from/to the same memory.

Nodes may read and write memory and update selected port parameters via any of the 64 ports of the memory controller using the point-to-point protocol. The memory controller performs forward and backward ACKing and maintains Consumer_Counts and Producer_Counts.

The memory controller recognizes a data word where the payload field contains data to be written to memory and a control word where the payload field contains port-update information and a bit indicating whether the update is to be followed by a read using the DAG. When the update is followed by a read request the control word is called a Read Request. Table 1, below, shows different types of control words. PTP data words and PTP control words may be sent to a memory Port in any order and are processed in the order received.

TABLE I

PTP Control-Word Fields

| Field | Description |
| --- | --- |
| Payload[27:0] | New Parameter Value |
| Payload[30:28] | 000: Update DAG_Origin |
| | 001: Update DAG_X_Index |
| | 010: Update DAG_X_Stride |
| | 011: Update DAG_X_Limit |
| | 100: Update DAG_Y_Index |
| | 101: Update DAG_Y_Stride |
| | 110: Update DAG_Y_Limit |
| | 111: Update Read_Count |
| Payload[31] | 0: No Read Request |
| | 1: Read Request |

Generally, data words and control words sent to the XMC are generated independently by separate tasks running on separate nodes. Therefore, when the XMC sends acknowledgements to the nodes to indicate that a control word or other message or information has been received, the XMC must send separate acknowledgments, with appropriate values, to the task or node that is producing data words. The task or node that is producing the data word is referred to as the "Data Producer". A task or node that is producing control words is referred to as the "Control Producer." The XMC maintains information on the Data Producer and Control Producer in order to properly send backward acknowledgements to both.

In general, tasks or nodes can be referred to as a "process" or as a component that performs processing. Although specific reference may be made to hardware or software components, it should be apparent that functions described herein may be performed by hardware, software or a combination of hardware and software.

In a preferred embodiment, all words—both data and control—arriving at a PTP/RTI port on the XMC are placed sequentially into the same temporary buffer. For a case where two types of words are generated independently, typically by different nodes, it is necessary to allocate a portion of the temporary buffer to data words and a portion to control words to prevent buffer overflow.

When a PTP Write, PTP Packet-Mode Write or RTI Write from the MIN is received on Port i the following actions are performed:
1) Place the 32-bit payload, together with a bit indicating whether the word is a data word or control word, sequentially into Port i's (33-bit-wide, circular) temporary buffer.

When a Forward Acknowledgement from the MIN is received on Port i:
1) Increment Ack_Count[i] by Ack Value (which is positive) (Note: Forward Acknowledgement's from the Data_Producer and the Control_Producer are treated identically.)
2) Place a Service Request for Port i in the PTP_DMA_Queue if one is not already pending When a Backward Acknowledgement from the MIN is received on Port i,
1) Increment Producer_Count[i] by Ack Value (which is negative)
2) If the sign bit of Producer_Count[i] is now a 1 (Producer_Count[i] is negative), place a Service Request for Port i in the PTP_DMA_Queue if one is not already pending When a Service Request for PTP/RTI-Port i is serviced:
1) Pop Port i from the PTP_DMA_Queue
2) If Status_Register[i].Port_Enabled=0
   a) Send a Port Disable Acknowledgement to the K-Node
   b) Terminate servicing of Port i
3) Load Port-i DAG parameters into corresponding DAG registers
4) Note: When DAG_Address_Mode[i]=1-D, the DAG uses the three X registers for reading and the three Y registers for writing
5) If ((Control_Register[i].Write_Port=1) OR (Producer_Count[i]<0)) AND (Control_Register[i].Buffer_Write=0) OR the main buffer is NOT full)
   a) Initialize signed-integer C to Ack_Count[i]/4
   b) While C>=0:
   i) Decrement C by 1
   ii) Remove double-word from temporary buffer
   iii) If the double-word is a data word:
       (1) Unpack data word from right to left[†] and write records to memory under DAG direction.
   iv) Else (if the double-word is a control word):
       (1) Update indicated DAG Parameter
       (2) If a read is indicated
       (a) Read Read_Count [i] records from memory under DAG direction, pack them from right to left into double-words and send to Consumer[i] via a sequence of PTP Read Data's
       (b) Break from While loop
   c) Decrement Ack_Count[i] by 4 times the total number of data and control double-words removed from Port i's temporary buffer 6) Increment Consumer Count[i] by 4 times the total number of data double-words removed from the Port i's temporary buffer and written to memory
7) Send a Backward Acknowledgement to Data_Producer [i] with an ACK value equal to minus 4 times the number of data words removed from Port i's temporary buffer; Omit if Control_Register[i].Port_Type=RTI or if no data words were consumed
8) Send a Backward Acknowledgement to Control_Producer[i] with an ACK value equal to minus 4 times the number of control words removed from Port i's temporary buffer, Omit if no control words were consumed
9) If Control_Register[i].Auto_Read=1 AND Producer_Count[i]<0 AND (Control_Register[i].Buffer_Read=0 OR Consumer_Count[i]>=0)
a) Read Read_Count[i] records from memory under DAG direction, pack them from right to left into double-words and send to Consumer[i] via a sequence of PTP Read Data's
10) Increment Producer Count[i] by 4 times the total number of double-words sent to Consumer[i] (via read requests and auto reads)
11) Decrement Consumer_Count[i] by 4 times the total number of double-words sent to Consumer[i] (via read requests and auto reads)
12) Send a Forward Acknowledgement to Consumer[i] with an ACK value equal to 4 times the number of double-words sent to Consumer[i] (via read requests and auto reads); Omit if no words were sent to Consumer[i]
13) If Update_Index[i]=1:
a) Update X_Index[i] DAG parameter with X_Index DAG register
b) Update Y_Index[i] DAG parameter with Y_Index DAG register
14) Push a Service Request for Port i onto the PTP_DMA_Queue if one is not already pending.

XMC Modes

In a preferred embodiment the XMC operates in eight basic modes. These include the following:

Basic Mode—Provides unrestricted reading of and writing to a data structure. A write occurs when there is data in the temporary buffer and old data overwritten. A read occurs after an explicit read request has been received and there is available space in the input buffer consuming node. It does not consume data.

High-Speed-Write Mode—Similar to Basic Mode with the exception that read requests are not supported, thereby achieving higher throughput in writing to memory.

Finite-Sink Mode—Provides finite sink for data. A write occurs when there is data in the temporary buffer and available space in the main buffer. Writing stops when the main buffer is full.

Auto-Source Mode—Provides an infinite source of data. A read occurs automatically when there is available space in the input buffer of the consuming node. Read Requests are not used.

Buffer Mode—Implements a buffer/FIFO. Writes fill the main buffer while reads drain the main buffer. A write occurs when there is data in the temporary buffer and available space in the main buffer. A read occurs when there is sufficient data in the main buffer and available space in the consuming node's input buffer.

Y-Wrap Mode—Permits a write to memory to end in the middle of a double-word for the case when Record_Size is either byte or (16-bit) word.

Burst Mode—A special high-throughput mode for reading and writing 2-D blocks of bytes. Similar to Y-Wrap Mode in that writes to memory can end in the middle of a double-word.

Burst-Write Mode—Identical to Burst Mode except that—like High-Speed-Write Mode—read requests are not permitted. Achieves higher throughput than Burst Mode in writing to memory.

Basic Mode

Basic Mode supports writing to and reading from memory with no restrictions on Port_Type, DAG parameters or the use of PTP control words. Reads are initiated either by a read request when Port_Type is PTP, PTP_Packet_Mode or RTI or by poking a 1 into DMA_Go when Port_Type is DMA.

Table II lists the Control and Status Bit parameters that define Basic Mode.

TABLE II

Settings for Basic Mode

| Parameter | Description |
| --- | --- |
| Auto_Read | 0: Port does not support automatic reads |
| Buffer_Read | 0: Consumer_Count not checked in auto read |
| Buffer_Write | 0: New data overwrites old data in memory |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 0: Normal mode; The port handles all incoming words |
| Burst | 0: Normal DAG-addressing mode |
| Random_Access | 0: Normal DAG addressing when performing read request |

Where:
1. The compound condition(ACK_Count>=0 AND Producer_Count<0) triggers the processing of words in the temporary buffer. ACK_Count≧0 indicates that there are words in the temporary buffer. Producer_Count<0 indicates that there is space available in the consumer's input buffer in the event that a read request is encountered.
2. Once processing begins, it continues until either a read request is encountered (and processed) or the entire contents of the temporary buffer—as indicated by ACK_Count when processing begins—has been dispatched.
3. Data words from the temporary buffer are unpacked from right to left[†] and the records written to main-memory under DAG direction. There is no flow control between the temporary buffer and main memory and so new data may overwrite old.
4. When a control word without a read is encountered, the indicated update is performed.
5. When a read request is encountered, the indicated update is performed and Read_Count records are then read from main memory under DAG direction, packed from right to left into double-words and sent to the consumer node.
6. Upon completion of processing:
a) ACK_Count is decremented by 4×the total number of words—both data and control—removed from the temporary buffer
b) Consumer_Count is incremented by 4×the total number of data words written to main memory
c) A Backward Acknowledgement is sent to Data Producer with an value equal to minus 4×the total number of data words—if any—written to main memory d) A Backward Acknowledgement is sent to Control Producer with an value equal to minus 4×the total number of control words—if any—that are processed
e) If a read request has been processed:
  i. Producer Count is incremented by 4×the number of double-words sent to Consumer
  ii. A Forward Acknowledgement is sent to Consumer with an value equal to 4×the number of double-words sent to Consumer
f) The port is placed back on the PTP/DMA service queue to process any remaining words in the temporary buffer
7. When a port is restricted to just writing—for example, when the port is a DMA sink—High-Speed-Write Mode is recommended due to its higher performance and because it is does not require Producer_Count<0 in order to process words from the temporary buffer.

High-Speed-Write Mode

High-Speed-Write Mode is similar to Basic Mode with the exception that read requests are not supported. This can allows advantages such as not requiring that Producer_Count<0 before words are removed from the temporary buffer is eliminated. Also, words can be removed from the temporary buffer at a higher rate.

Table III lists the Control and Status Bit parameters that define High-Speed-Write Mode.

TABLE III

Parameters for High-Speed-Write Mode

| Parameter | Description |
| --- | --- |
| Auto_Read | 0: Port does not support automatic reads |
| Buffer_Read | 0: Consumer_Count not checked in auto read |
| Buffer_Write | 0: New data overwrites old data in memory |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 1: High-speed mode; the port does not support read requests |
| Burst | 0: Normal DAG-addressing mode |
| Random_Access | 0: Normal DAG addressing when performing read request |

Where:
1. ACK_Count≧0, indicating that there are words in the temporary buffer triggers the processing of those words.
2. Once processing begins, the entire contents of the temporary buffer—as indicated by ACK_Count when processing begins—is processed.
3. Data words from the temporary buffer are unpacked from right to left† and the records written to main-memory under DAG direction. There is no flow control between the temporary buffer and main memory and so new data may overwrite old.
4. When a control word is encountered, the indicated update is performed.
5. Upon completion of processing:
  a) ACK_Count is decremented by 4×the total number of words—both data and control—removed from the temporary buffer
  b) Consumer_Count is incremented by 4×the total number of data words written to main memory
  c) A Backward Acknowledgement is sent to Data Producer with a value equal to minus 4×the total number of data words—if any—written to main memory
  d) A Backward Acknowledgement is sent to Control Producer with a value equal to minus 4×the total number of control words—if any—that are processed
6. High-Speed-Write Mode is the recommended mode when a port is a DMA sink.

Finite-Sink Mode

Finite-Sink mode allows data to be written to memory and preserved from being overwritten by subsequent data. This is useful, for example, for storing statistics data, an error log, etc. Table IV lists the Control and Status Bit parameters that define Finite-Sink Mode.

TABLE IV

Parameters for Finite-Sink Mode

| Parameter | Description |
| --- | --- |
| Auto_Read | 0: Port does not support automatic reads |
| Buffer_Read | 0: Consumer_Count not checked in auto read |
| Buffer_Write | 1: No writes to main-memory buffer when full |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 1: High-speed mode; Port does not support read requests |
| Burst | 0: Normal DAG-addressing mode |
| Random_Access | 0: Normal DAG addressing when performing read request |

Where:
1. The compound condition (ACK_Count>=0 AND Consumer_Count+Buffer_Full_Offset<0) triggers the processing of words in the temporary buffer. ACK_Count≧0 indicates that there are words in the temporary buffer. Consumer_Count+Buffer_Full_Offset<0 indicates that there is at least a temporary-buffer's worth of available space in the main-memory buffer.
2. Once processing begins, the entire contents of the temporary buffer—as indicated by ACK_Count when processing begins—is processed.
3. Data words from the temporary buffer are unpacked from right to left† and the records written to main-memory under DAG direction. There is flow control between the temporary buffer and main memory and so new data does not overwrite old.
4. When a control word is encountered, the indicated update is performed.
5. Upon completion of processing:
  a) ACK_Count is decremented by 4×the total number of words—both data and control—removed from the temporary buffer
  b) Consumer_Count is incremented by 4×the total number of data words written to main memory
  c) A Backward Acknowledgement is sent to Data Producer with a value equal to minus 4×the total number of data words—if any—written to main memory
  d) A Backward Acknowledgement is sent to Control Producer with a value equal to minus 4×the total number of control words—if any—that are processed
6. Once Consumer_Count+Buffer_Full_Offset≧0, all processing of words from the temporary buffer stops and any remaining words in the temporary buffer remain there.

Auto-Source Mode

An application may need to make use of tables of constants. For example, wave tables, pseudo-random data, etc., are typically written at system initialization and accessed in a continuous stream during real-time operation. Auto-Source Mode provides a means for accessing such data. Table V lists the Control and Status Bit parameters that define Auto-Source Mode.

TABLE V

Parameters for Auto-Source Mode

| Parameter | Description |
|---|---|
| Auto_Read | 1: Producer/Consumer counts can automatically trigger a read |
| Buffer_Read | 0: Consumer_Count not checked in auto read |
| Buffer_Write | 0: New data overwrites old data in memory |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 1: High-speed mode; The port does not support read requests |
| Burst | 0: Normal DAG-addressing mode |
| Random_Access | 0: Normal DAG addressing when performing read request |

Where:

1. Whenever Producer_Count<0, Read_Count records are read from main memory under DAG direction, packed from right to left[†] into double-words and sent to Consumer. After each auto read:
   a) Producer_Count is incremented by 4×the number of double-words sent to Consumer
   b) A Forward Acknowledgement is sent to Consumer with a value equal to 4×the number of double-words sent to Consumer
2. ACK_Count≧0, indicating that there are words in the temporary buffer, triggers the processing of those words.
3. Once processing begins, the entire contents of the temporary buffer—as indicated by ACK_Count when processing begins—is processed.
4. Data words from the temporary buffer are unpacked from right to left and the records written to main-memory under DAG direction. There is no flow control between the temporary buffer and main memory and so new data may overwrite old.
5. When a control word is encountered, the indicated update is performed.
6. Upon completion of processing:
   a) ACK_Count is decremented by 4×the total number of words—both data and control—removed from the temporary buffer
   b) Consumer_Count is incremented by 4×the total number of data words written to main memory
   c) A Backward Acknowledgement is sent to Data Producer with a value equal to minus 4×the total number of data words—if any—written to main memory
   d) A Backward Acknowledgement is sent to Control Producer with a value equal to minus 4×the total number of control words—if any that are processed.

Buffer Mode

In a preferred embodiment, a port in Buffer Mode implements a first-in-first-out queue. A delay line—a queue in which the amount of data in the queue remains above a threshold—is a form of FIFO and can also be implemented in Buffer Mode. Table VI lists the Control and Status Bit parameters that define Buffer Mode.

TABLE VI

Parameters for Buffer Mode

| Parameter | Description |
|---|---|
| Auto_Read | 1: Producer/Consumer counts can automatically trigger a read |
| Buffer_Read | 1: Consumer_Count >= 0 for auto read |
| Buffer_Write | 1: No writes to main-memory buffer when full |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 1: High-speed mode; The port does not support read requests |
| Burst | 0: Normal DAG-addressing mode |
| Random_Access | 0: Normal DAG addressing when performing read request |

Where:

1. The compound condition (ACK_Count>=0 AND Consumer_Count+Buffer_Full_Offset<0) triggers the processing of words in the temporary buffer. ACK_Count≧0 indicates that there are words in the temporary buffer. Consumer_Count+Buffer_Full_Offset<0 indicates that there is at least a temporary-buffer's worth of available space in the main-memory buffer.
2. Once processing begins, the entire contents of the temporary buffer—as indicated by ACK_Count when processing begins—is processed.
3. Data words from the temporary buffer are unpacked from right to left[†] and the records written to main-memory under DAG direction There is flow control between the temporary buffer and main memory and so new data does not overwrite old.
4. When a control word is encountered, the indicated update is performed.
5. When processing of words from the temporary buffer is completed:
   a) ACK_Count is decremented by 4×the total number of words—both data and control—removed from the temporary buffer
   b) Consumer_Count is incremented by 4×the total number of data words written to main memory
   c) A Backward Acknowledgement is sent to Data Producer with a value equal to minus 4×the total number of data words—if any—written to main memory
   d) A Backward Acknowledgement is sent to Control Producer with a value equal to minus 4×the total number of control words—if any—that are processed
7. The compound condition (Consumer_Count>=0 AND Producer_Count<0) triggers an auto read in which Read_Count records are read from main memory under DAG direction, packed from right to left into double-words and sent to Consumer. After each auto read:
   a) Consumer_Count is decremented by 4×the number of double-words removed from the main memory buffer
   b) Producer_Count is incremented by 4×the number of double-words sent to Consumer c) A Forward Acknowledgement is sent to Consumer with a value equal to 4×the number of double-words sent to Consumer
8. The initial value of Consumer_Count sets a threshold on the amount of data in the main-memory buffer necessary for an auto read to occur. If the initial value of Consumer_Count is −n, then n is the amount of data, expressed in bytes, necessary for an auto read to occur.
9. The minimum number of double-words in the main-memory buffer—after an initial transient phase when the buffer is filling up—is: Initial value of Consumer_Count)/4+Read_Count) double-words
10. For example, if the initial value of Consumer_Count is −40,000 (bytes) and Read_Count is 100 (double-words) then an auto read occurs only after 10,000 double-words (40,000 bytes) have been written into the main-memory buffer. When an auto read does occur, 100 double-words are removed from the buffer and Consumer_Count is decremented by 400 bytes). Since there must have been at least 10,000 double-words in buffer before the auto read occurred, there must be at least 10,000−100=9,900 double-words in the buffer after the auto read occurred. This number, 9,900, is the minimum number of double-words that can be in the main-memory buffer after the initial transient when the buffer is filling up.

Y-Wrap Mode

Y-Wrap Mode, along with Burst Mode and Burst-Write Mode, permit a write to memory to end in the middle of a double-word. Y-Wrap Mode can be used, for example, when writing a block of pixels (bytes) by rows into a two-dimensional frame buffer. In this case, the Y Wrap occurs when the last pixel of the block is written into memory. Any remaining bytes in the last data word are discarded and the next block of pixels begins with a new data word from the MIN. Table VII lists the Control and Status Bit parameters that define Y-Wrap Mode.

TABLE VII

Parameters for Y-Wrap Mode

| Parameter | Description |
| --- | --- |
| Auto_Read | 0: Port does not support automatic reads |
| Buffer_Read | 0: Consumer_Count not checked in auto read |
| Buffer_Write | 0: New data overwrites old data in memory |
| Update_Index | 1: Update DAG_X_Index and DAG_Y_Index after each DAG use |
| New_MIN_Word_On_YWrap | 1: Start unpacking/packing new MIN word when DAG_Y_Index wraps |
| High_Speed_Write | 1: High-speed mode; The port does not support read requests |
| Burst | 0: Normal DAG-addressing mode |
| Random_Access | 0: Normal DAG addressing when performing read request |

Where:
1. ACK_Count≧0, indicating that there are words in the temporary buffer, triggers the processing of those words.
2. Once processing begins, the entire contents of the temporary buffer—as indicated by ACK_Count when processing begins—is processed.
3. Data words from the temporary buffer are unpacked from right to left[†] and the records written to main-memory under DAG direction. Upon a Y Wrap (DAG_Y_Index wraps around), writing is immediately terminated and any remaining records in the data (double-) word are discarded.

[†]Records are packed and unpacked from right to left because the XMC is little endian.

4. There is no flow control between the temporary buffer and main memory and so new data may overwrite old.
5. When a control word is encountered in the temporary buffer, the indicated update is performed.
6. When processing of words from the temporary buffer is completed:
    a) ACK_Count is decremented by 4×the total number of words—both data and control—removed from the temporary buffer
    b) Consumer_Count is incremented by 4×the total number of data words written to main memory
    c) A Backward Acknowledgement is sent to Data Producer with a value equal to minus 4×the total number of data words—if any—written to main memory
    d) A Backward Acknowledgement is sent to Control Producer with a value equal to minus 4×the total number of control words—if any—that are processed
7. Example: Suppose Record Size=byte, DAG_Address_Mode=2-D and the DAG is configured to address a 9×9 block of records. When the 21$^{st}$ double-word of an incoming block is encountered, only the right-most byte—which is the 81$^{st}$ byte of the block—is written to memory because DAG_Y_Index wraps immediately after that byte is written. The remaining three bytes in the double-word are discarded and writing of the next block begins with a new double-word from the MIN.

Burst Mode

Burst Mode can be useful in imaging or video applications (e.g., MPEG4, HDTV, etc.) that have high bandwidth/throughput requirements. In a preferred embodiment, Burst Mode makes use of the Double Data Rate (DDR) feature of DDR DRAM. Other applications can use other types of memory and need not use the DDR feature. Burst Mode allows blocks of pixels to be either written to or read from memory at very high rates. Burst Mode terminates writing (and reading) of a double-word on an X-Wrap. This difference means that each line, not just each block, begins with a new double-word. Table VIII lists the Control and Status Bit parameters that define Burst Mode.

TABLE VIII

Parameters for Burst Mode

| Parameter | Description |
| --- | --- |
| Auto_Read | 0: Port does not support automatic reads |
| Buffer_Read | 0: Consumer_Count not checked in auto read |
| Buffer_Write | 0: New data overwrites old data in memory |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 0: Normal mode; The port handles all incoming words |
| Burst | 1: High-throughput mode for accessing contiguous blocks of 2-D data |
| Random_Access | 0: Normal DAG addressing when performing read request |

Where:
1. The compound condition (ACK_Count>=0 AND Producer_Count<0) triggers the processing of words in the temporary buffer. ACK_Count≧0 indicates that there are words in the temporary buffer. Producer_Count<0 indicates that there is space available in the consumer's input buffer in the event that a read request is encountered.

2. Once processing begins, it continues until either a read request is encountered (and processed) or the entire contents of the temporary buffer—as indicated by ACK_Count when processing begins—has been dispatched.
3. Data words from the temporary buffer are unpacked from right to left[†] and the records written to main-memory under DAG direction. Upon an X Wrap (DAG_X_Index wraps around), writing is immediately terminated and any remaining records in the data (double-) word are discarded.

[†]Records are packed and unpacked from right to left because the XMC is little endian.

4. There is no flow control between the temporary buffer and main memory and so new data may overwrite old.
5. When a control word without a read is encountered, the indicated update is performed.
6. When a read request is encountered, the indicated update is performed and Read_Count records are then read from main memory under DAG direction, packed from right to left into double-words and sent to the consumer node.
7. Upon completion of processing:
   a) ACK_Count is decremented by 4×the total number of words—both data and control—removed from the temporary buffer
   b) Consumer_Count is incremented by 4× the total number of data words written to main memory
   c) A Backward Acknowledgement is sent to Data Producer with a value equal to minus 4×the total number of data words—if any—written to main memory
   d) A Backward Acknowledgement is sent to Control Producer with a value equal to minus 4×the total number of control words—if any—that are processed
   e) If a read request has been processed:
      i. Producer_Count is incremented by 4×the number of double-words sent to Consumer
      ii. A Forward Acknowledgement is sent to Consumer with a value equal to 4×the number of double-words sent to Consumer
   f) The port is placed back on the PTP/DMA service queue to process any remaining words in the temporary buffer
8. In the restriction above—The Data Producer ACKs in multiples of 4×ceil (DAG_X_Limit/4)–ceil (DAG_X_Limit/4) is the number of double-words needed for each line in a block of pixels. 4×ceil(DAG_X_Limit/4) is that number converted to bytes. The restriction guarantees that ACK_Count will always reflect an integral number of lines in the temporary buffer and the port will therefore always write an integral number of lines to memory.
9. The restriction above—Read_Count is an integer multiple of DAG_X_Limit—guarantees that the port will always read an integral number of lines from memory.
10. Write example: Suppose Record_Size=byte, DAG_Address_Mode=2-D and the DAG is configured to address a 9×9 block of records. When the $3^{rd}$, $6^{th}$, $9^{th}$, $12^{th}$, $15^{th}$, $18^{th}$, $21^{st}$, $24^{th}$ or $27^{th}$ double-word of an incoming block is encountered, only the right-most byte—which is the $9^{th}$ byte of a line—is written to memory because DAG_X_Index wraps immediately after that byte is written. The remaining three bytes in the double-word are discarded and writing of the next line in the block begins with a new double-word from the MIN. Notice that this incoming 9×9 block of pixels requires 27 double-words in Burst Mode, but only 21 double-words in Y-Wrap Mode.
11. Read example: Suppose Record_Size=byte, DAG_Address_Mode=2-D, the DAG is configured to address a 9×9 block of records and Read_Count=81. Now suppose that a read request is encountered in the temporary buffer. The port will read bytes from memory and pack them into outgoing double-words. But when the port gets to the $3^{rd}$, $6^{th}$, $9^{th}$, $12^{th}$, $15^{th}$, $18^{th}$, $21^{st}$, $24^{th}$ or $37^{th}$ double-word, it will place only a single byte—the $9^{th}$ byte of a line—in the double-word (in the right-most position) because DAG_X_Index wraps immediately after that byte is read. The next byte—the first byte of the next line—goes into a new double-word. Notice that this outgoing 9×9 block of pixels requires 27 double-words in Burst Mode, but only 21 double-words in Basic Mode.

Burst-Write Mode

Burst-Write Mode allows higher throughput than Burst Mode by not supporting read requests and by not requiring Producer_Count<0 in order to begin processing words from the temporary buffer. Table IX lists the Control and Status Bit parameters that define Burst-Write Mode.

TABLE IX

Parameters for Burst-Write Mode

| Parameter | Description |
| --- | --- |
| Auto_Read | 0: Port does not support automatic reads |
| Buffer_Read | 0: Consumer_Count not checked in auto read |
| Buffer_Write | 0: New data overwrites old data in memory |
| Update_Index | 1: Update DAG_X_Index and DAG_Y_Index after each DAG use |
| New_MIN_Word_On_YWrap | 0: Ignore DAG_Y_Index wrap when unpacking/packing MIN words |
| High_Speed_Write | 1: High-speed mode; The port does not support read requests |
| Burst | 1: High-throughput mode for accessing contiguous blocks of 2-D data |
| Random_Access | 0: Normal DAG addressing when performing read request |

Where:
1. ACK_Count>0, indicating that there are words in the temporary buffer, triggers the processing of those words.
2. Once processing begins, the entire contents of the temporary buffer—as indicated by ACK_Count when processing begins—is processed.
3. Data words from the temporary buffer are unpacked from right to left[†] and the records written to main-memory under DAG direction. Upon an X Wrap (DAG_X_Index wraps around), writing is immediately terminated and any remaining records in the data (double-) word are discarded.
4. There is no flow control between the temporary buffer and main memory and so new data may overwrite old.
5. When a control word is encountered in the temporary buffer, the indicated update is performed.
6. Upon completion of processing:
   a) ACK_Count is decremented by 4×the total number of words—both data and control—removed from the temporary buffer
   b) Consumer_Count is incremented by 4×the total number of data words written to main memory c) A Backward Acknowledgement is sent to Data Producer with a value equal to minus 4×the total number of data words—if any—written to main memory
d) A Backward Acknowledgement is sent to Control Producer with a value equal to minus 4×the total number of control words—if any—that are processed
7. In the restriction above—The Data Producer ACKs in multiples of 4×ceil (DAG_X_Limit/4)—ceil(DAG_X_Limit/4) is the number of double-words needed for each line in a block of pixels. 4×ceil(DAG_X_Limit/4) is that number converted to bytes. The restriction guarantees that ACK_Count will always reflect an integral number of lines in the temporary buffer and the port will therefore always write an integral number of lines to memory.
8. Write Example: Suppose Record_Size=byte, DAG_Address_Mode=2-D and the DAG is configured to address a 9×9 block of records. When the $3^{rd}$, $6^{th}$, $9^{th}$, $12^{12}$, $15^{th}$, $18^{th}$, $21^{st}$, $24^{th}$ or $27^{th}$ double-word of an incoming block is encountered, only the right-most byte—which is the $9^{th}$ byte of a line—is written to memory because DAG_X_Index wraps immediately after that byte is written. The remaining three bytes in the double-word are discarded and writing of the next line in the block begins with a new double-word from the MIN. Notice that this incoming 9×9 block of pixels requires 27 double-words in Burst Mode, but only 21 double-words in Y-Wrap Mode.

Applications

The features of the XMC can be used to advantage in different ways depending on a specific application. For example, in a "data-sinking" application it is sometimes necessary to store information about system performance (e.g., statistics or an error log) in memory. The data may have to be stored in real time and prevented from being overwritten by subsequent data. An XMC port configured in Finite-Sink Mode can provide that capability. The parameter settings for this mode are shown in Table X, below.

Real-time data are written into a buffer in memory until the buffer becomes full whereupon writing ceases. The data can be read at any time via a read request.

TABLE X

Data-Sinking Application

| | Read/Write Port i |
|---|---|
| PTP/DMA_Mode | Finite-Sink Mode |
| Record_Size | double-word (32 bits) |
| Read_Count | read-block size (records) |
| Addressing_Mode | 1-D |
| DAG_Origin | start of buffer |
| DAG_X_Index | read pointer (initialized to 0) |
| DAG_X_Stride | 4 (bytes) |
| DAG_X_Limit | buffer size (bytes) |
| DAG_Y_Index | write pointer (initialized to 0) |
| DAG_Y_Stride | 4 (bytes) |
| DAG_Y_Limit | buffer size (bytes) |

Another application is known as "data sourcing". Applications sometimes require a large or unbounded stream of fixed data—pseudo-random data or a wave table, for example—during real-time operation.

To provide the stream an XMC port can be configured in Auto-Source Mode accessing a circular buffer in memory containing the fixed data configured according to Table XI. The fixed data—which is typically written into the buffer at system initialization—can be supplied automatically to the consumer node, the flow being governed by normal PTP flow control using Forwards and Backwards ACKs. Because the buffer is circular and Buffer_Read is turned off, the port provides an infinite source of data.

TABLE XI

Data-Sourcing Application

| | Read/Write Port i |
|---|---|
| PTP/DMA_Mode | Auto-Source Mode |
| Record_Size | double-word (32 bits) |
| Read_Count | read-block size (records) |
| Addressing_Mode | 1-D |
| DAG_Origin | start of buffer |
| DAG_X_Index | read pointer (initialized to 0) |
| DAG_X_Stride | 4 (bytes) |
| DAG_X_Limit | buffer size (bytes) |
| DAG_Y_Index | write pointer (initialized to 0) |
| DAG_Y_Stride | 4 (bytes) |
| DAG_Y_Limit | buffer size (bytes) |

Another type of application may require implementation of "delay lines." For example, digital audio broadcast, personal video recorders, modeling of acoustics, etc., types of applications can require a signal to be delayed by a number of samples. This requirement usually means that there will always be a certain minimum number of samples in the delay line once the line reaches steady-state operation (once the number of samples in the delay line reaches a threshold).

A delay line is implemented using a single port configured in Buffer Mode with Record_Size set to double-word as shown in Table XII. The circular buffer in main memory is accessed by DAG_X_Index for reading and DAG_Y_Index for writing. The initial value of Consumer_Count determines the length/size of the delay line: it is initialized to minus the size of the delay, converted to bytes.

For example, to implement a delay line of 1,000,000 double-words, a buffer of at least 4,000,000 bytes is allocated in memory and Consumer_Count is initialized to −4,000,000 as illustrated in Table. Because of the initial value of Consumer_Count, no output appears until at least 1,000,000 double-words have been written into the buffer and Consumer_Count has been incremented by a cumulative value of at least +4,000,000 (by Forward ACKs from the Data Producer). After that threshold has been reached and Consumer_Count has been driven non-negative, an auto read occurs.

In this example, the consumer node expects to get data from the delay line in blocks of 100 double-words, and so Read_Count is set to 100 (records). Upon an auto read, 100 double-words are removed from the buffer and sent to the Consumer (assuming Producer_Count<0). Consumer_Count is then decremented by 400 (bytes). If the new value of Consumer_Count is still non-negative, then another auto read occurs and the cycle is repeated. If the new value of Consumer_Count is negative, then reading is inhibited until additional double-words are written into the buffer and Consumer_Count is again driven non-negative.

In summary, once the number of samples in the delay line reaches at least 1,000,000 and Consumer_Count becomes non-negative, Consumer_Count never drops below −400 and the number of double-words in the delay line never drops below 999,900.

TABLE XII

Delay-Line Application

| | Read/Write Port i |
|---|---|
| PTP/DMA_Mode | Buffer Mode |
| Record_Size | double-word (32 bits) |
| Read_Count | 100 (records) |
| Consumer_Count | −4,000,000 (initial value in bytes) |
| Addressing_Mode | 1-D |
| DAG_Origin | start of buffer |
| DAG_X_Index | read pointer (initialized to 0) |
| DAG_X_Stride | 4 (bytes) |
| DAG_X_Limit | ≧4,000,000 (buffer size in bytes) |
| DAG_Y_Index | write pointer (initialized to 0) |
| DAG_Y_Stride | 4 (bytes) |
| DAG_Y_Limit | ≧4,000,000 (buffer size in bytes) |

Another type of application may require "data reordering" in which the elements in a block of data need to be reordered. Table XIII illustrates an application—sometimes called a corner-turner or corner-bender—that interchanges the rows and columns of a two-dimensional block of data. The application example uses two XMC ports—Write Port i and Read Port j—both accessing the same two-dimensional buffer in memory.

For example, bytes can be written four at a time to memory by rows (lines) using Port i, which has the DAG, configured in 1-D mode. (2-D mode could have been used, but 1-D is simpler and generates the same sequence of addresses.) When the Data Producer receives acknowledgement from the XMC that all data has been written to main memory, it signals the Consumer to begin reading. The Consumer sends a backwards ACK to XMC Port j thereby driving Producer_Count negative and enabling a read.

Bytes are read from memory by columns using Port j with the DAG in 2-D mode. But because reading is by columns and not rows, the usual roles of DAG_X_Index and DAG_Y_Index are reversed. DAG_X_Index now indexes successive bytes in a column, and DAG_Y_Index now indexes successive columns in the 2-D block. More precisely, DAG_X_Index=R X line-length DAG_Y_Index=C where R and C are the row and column, respectively, of a byte in the 2-D block. After each byte is read, DAG_X_Index is incremented by line-length thereby accessing the next byte in the column. After the last byte in the column is read, DAG_X_Index reaches L X line-length, where L is the number of lines (rows) in the 2-D block. But L X line-length=buffer-size=DAG_X_Limit and therefore DAG_X_Index wraps around to 0 and DAG_Y_Index is incremented by 1. The cycle is repeated for each column until DAG_Y_Index=line-length=DAG_Y_Limit, the indication that the entire block has been read. When the Consumer receives the entire block of data, it signals the Data Producer to begin writing once again.

TABLE XIII

Data-Reordering Application

| | Write Port i | Read Port j |
|---|---|---|
| PTP/DMA_Mode | High-Speed-Write Mode | Basic Mode |
| Buffer_Read | 0 | 0 |
| Buffer_Write | 0 | 0 |
| Record_Size | double-word | byte |
| Read_Count | — | read-block size (records) |
| Addressing_Mode | 1-D | 2-D |
| DAG_Origin | start of buffer | start of buffer |
| DAG_X_Index | — | 0 (initial value) |
| DAG_X_Stride | — | line length (bytes) |
| DAG_X_Limit | — | buffer size (bytes) |
| DAG_Y_Index | write pointer (initialized to 0) | 0 (initial value) |
| DAG_Y_Stride | 4 (bytes) | 1 (byte) |
| DAG_Y_Limit | buffer size (bytes) | line length (bytes) |

The XMC allows interlacing, or multiplexing, of multiple data streams into a single data stream. In Table XIV two streams arriving on XMC Ports i and j are combined in memory and then read from memory via XMC Port k.

In a preferred embodiment interlacing of the two streams is accomplished by writing bytes arriving on Port i to even byte addresses in the main-memory buffer, and writing bytes arriving on Port j to odd byte addresses. (Note that when DAG_Y_Index for Port i wraps around it returns to 0, but when DAG_Y_Index for Port j wraps around it returns to 1.)

Synchronizing of writing and reading is accomplished using a double buffering scheme in which the two Data Producers write into one half of the main-memory buffer while the Consumer reads the other half. To make the scheme work, each Data Producer signals the Consumer when it receives acknowledgement from the XMC that buffer-size/4 bytes have been written into the main-memory buffer. When the Consumer receives a signal from each Data Producer, it sends a backwards ACK to XMC Port k thereby driving Producer_Count negative and enabling a read of the interlaced data. When the Consumer receives buffer-size/2 bytes of interlaced data, it signals each Data Producer that they are permitted to write into the buffer half just read.

TABLE XIV

Data-Interlacing Application

| | Write Port i | Write Port j | Read Port k |
|---|---|---|---|
| PTP/DMA_Mode | Y-Wrap Mode | Y-Wrap Mode | Basic Mode |
| Record_Size | byte | byte | word (16 bits) |
| Read_Count | — | — | buffer size/4 (records) |
| Addressing_Mode | 1-D | 1-D | 1-D |
| DAG_Origin | start of buffer | start of buffer + 1 | start of buffer |
| DAG_X_Index | — | — | 0 (initial value) |
| DAG_X_Stride | — | — | 2 (bytes) |
| DAG_X_Limit | — | — | buffer size (bytes) |
| DAG_Y_Index | 0 (initial value) | 0 (initial value) | — |
| DAG_Y_Stride | 2 (bytes) | 2 (bytes) | — |
| DAG_Y_Limit | buffer size (bytes) | buffer size (bytes) | — |

Data de-interlacing (de-multiplexing) is accomplished whereby instead of merging two data streams into one, one data stream is separated into two.

Table XV illustrates an application that reverses the interlacing operation described in the preceding section. The input data stream arrives on XMC Port i and the two de-interlaced streams exit the XMC via Ports j and k. De-interlacing is accomplished by reading even bytes in the main-memory buffer using Port j and odd bytes using Port k. (Note that when DAG_X_Index for Port j wraps around it returns to 0, but when DAG_X_Index for Port k wraps around it returns to 1.)

Synchronizing of writing and reading is accomplished using a double-buffering scheme in which the Data Producer writes into one half of the main-memory buffer while the two Consumers read the other half. To make the scheme work, the Data Producer notifies the Consumers when it receives acknowledgement from the XMC that buffer-size/2 bytes have been written into the buffer. When the two Consumers receive the signal, they each send a backwards ACK to their XMC read port thereby driving Producer_Count negative and enabling a read of the de-interlaced data. When each Consumer receives buffer-size/4 bytes of data, it notifies the Data Producer that reading of the half buffer has been completed. The Data Producer waits until it receives notification from both Consumers before it begins writing into the just-vacated half buffer.

TABLE XV

Data De-Interlacing Application

| | Write Port i | Read Port j | Read Port k |
|---|---|---|---|
| PTP/DMA_Mode | Y-Wrap Mode | Basic Mode | Basic Mode |
| Record_Size | word (16 bits) | byte | byte |
| Read_Count | — | buffer size/4 (records) | buffer size/4 (records) |
| Addressing_Mode | 1-D | 1-D | 1-D |
| DAG_Origin | start of buffer | start of buffer | start of buffer + 1 |
| DAG_X_Index | — | 0 (initial value) | 0 (initial value) |
| DAG_X_Stride | — | 2 (bytes) | 2 (bytes) |
| DAG_X_Limit | — | buffer size (bytes) | buffer size (bytes) |
| DAG_Y_Index | 0 (initial value) | — | — |
| DAG_Y_Stride | 2 (bytes) | — | — |
| DAG_Y_Limit | buffer size (bytes) | — | — |

Many video compression algorithms (e.g., MPEG) require reading numerous rectangular blocks of pixels (bytes) from a frame buffer. Table Ie XVI illustrates an application in which data are written sequentially into a frame buffer via XMC Port i and in which rectangular blocks within the frame are read via XMC Port j.

A Data Producer for Port i writes data into the frame buffer line-by-line via Port i, and when it receives acknowledgement from the XMC that the entire frame has been written to memory, it notifies the Control Producer for Port j.

A Control Producer for Port j then sends a separate read request (see Section Error! Reference source not found.) to Port j for each block of pixels to be read, the parameter-update value in the request being used to update DAG_Origin. This newly updated value for DAG_Origin determines the location of the block to be read. The remaining DAG parameters determine the size of the block to be read. Table illustrates the parameter settings for a 9×9 block of pixels (bytes).

TABLE XVI

Frame-Buffer Application

| | Write Port i | Read Port j |
|---|---|---|
| PTP/DMA_Mode | High-Speed-Write Mode | Basic Mode or Burst Mode |
| Record_Size | double-word (32 bits) | byte |
| Read_Count | — | 81 (records) |
| Addressing_Mode | 1-D | 2-D |
| DAG_Origin | start of buffer | updated via read request |
| DAG_X_Index | — | 0 (initial value) |
| DAG_X_Stride | — | 1 (byte) |
| DAG_X_Limit | — | 9 (bytes) |
| DAG_Y_Index | 0 (initial value) | 0 (initial value) |

TABLE XVI-continued

Frame-Buffer Application

| | Write Port i | Read Port j |
|---|---|---|
| DAG_Y_Stride | 4 (bytes) | line length (bytes) |
| DAG_Y_Limit | buffer size (bytes) | 9 × line length (bytes) |

The XMC provides a scheme employing indirect addressing. In indirect addressing data is accessed in two steps: (1) an address (pointer) is used to access a second address (pointer) and (2) this second address is used in turn to access user data. The XMC implements indirect addressing via two tables, Table A and Table B, both residing in main memory as shown in Table XVII. Table A—which is accessed via XMC Port j—contains pointers into Table B. Table B—which is accessed via XMC Port k—contains user data.

Port j is configured in Auto-Source Mode and the entries in Table 1 are read automatically, in order, and sent via PTP control words from XMC Port j to XMC Port k. (Note the Consumer_ID and Consumer_Port for Port j.) Normal PTP flow control between Port j and Port k guarantees that the input buffer on Port k never overflows.

Each entry in Table A has a format where bit 31 (TableAEntry[31]) is set to 1, bits 30-28 (TableAEntry[30:28]) are set to 001 and bits 27-0 are used for the new DAG_X_Index value. TableAEntry[30:28]=001 indicates that DAG_X_Index[k] is to be updated with the value in TableAEntry[27:0]. TableAEntry[31]=1 indicates that the update is to be immediately followed by a read of Table B.

Port k responds to read requests from Port j as it would from any other source. It updates the appropriate DAG parameter—DAG_X_Index in this case—and then sends Read_Count records to the consumer of user data. Normal PTP flow control between XMC Port k and the data consumer guarantees that the data-consumer's input buffer never overflows.

TABLE XVII

Indirect-Addressing Application

| | Read Port j (Table A) | Read Port k (Table B) |
|---|---|---|
| PTP/DMA_Mode | Auto-Source Mode | Basic Mode |
| Consumer_ID | XMC (Consumer_ID[0] = 1 indicating a control word) | consumer of user data |
| Consumer_Port | K | consumer port |
| Record_Size | double-word (32 bits) | user defined |
| Record Format | { 1, 001, Pointer[27:0] } (Record[31] = 1 indicates a read request) (Record[30:28] = 001 indicates X_Index update) | user defined |
| Read_Count | ½ size of the input buffer of Port k | typically 1 (record) |
| Addressing_Mode | 1-D | 1-D |
| DAG_Origin | start of Table A | start of Table B |
| DAG_X_Index | 0 (initial value) | updated via read request from Port j |
| DAG_X_Stride | 4 (bytes) | — |
| DAG_X_Limit | size of Table 1 (bytes) | — |
| DAG_Y_Index | — | — |
| DAG_Y_Stride | — | — |
| DAG_Y_Limit | — | — |

Although the invention has been described with respect to specific embodiments thereof, these embodiments are merely illustrative, and not restrictive, of the invention. For example, although a PIN has been described as a data transfer mechanism other embodiments can use any type of network or interconnection scheme.

Any suitable programming language can be used to implement the routines of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A computing machine comprising:
   a memory;
   a plurality of heterogeneous computational nodes embodied in an integrated circuit and configured to make requests for memory accesses to the memory; and
   a memory controller configured to place the requests for memory accesses in a queue and allow accesses by the heterogeneous computational nodes to the memory in an order established by the queue.

2. The computing machine of claim 1, wherein the memory controller allows multiple independent simultaneous requests for memory accesses by the heterogeneous computational nodes to the memory.

3. The computing machine of claim 1, wherein the memory controller includes a predefined number of memory channels and is configured to receive memory requests assigned to corresponding memory channels of the predefined number of memory channels.

4. The computing machine of claim 3, wherein the memory controller is configured to allow accesses by the heterogeneous computational nodes to the memory over the assigned memory channels.

5. The computing machine of claim 3, wherein the memory controller is configured to allow requests sent over different channels of the plurality of memory channels to be processed in an order other than the order in which the requests are received by the memory controller.

6. The computing machine of claim 1, wherein the memory controller includes ports that have parameters, the memory controller configured to generate memory locations for the requests based on the parameters and to allow accesses by the heterogeneous computational nodes to the memory at the memory locations in response to the requests.

7. The computing machine circuit of claim 6, wherein the parameters are configured by the memory controller in response to a peek or a poke.

8. The computing machine of claim 1, wherein the memory controller includes ports having parameters configured by the memory controller in response to the memory requests, the memory controller configured to allow accesses by the heterogeneous computational nodes to the memory using the configured parameters of the ports.

9. The computing machine of claim 8, wherein the parameters are configured by the memory controller in response to a peek or a poke.

10. The computing machine of claim 1, further comprising a programmable interconnection network providing programmable interconnections among the heterogeneous computational nodes and the memory controller, the programmable interconnection network routing the requests from the heterogeneous computational nodes to the memory controller, routing data for the requests between the heterogeneous computational nodes and the memory via the memory controller, and routing data between the heterogeneous computational nodes.

11. The computing machine of claim 1, wherein the computing machine is in communication with an external memory device, and wherein the memory controller is configured to place the memory requests in a queue for the external memory device and allow accesses by the heterogeneous computational nodes to the external memory device in an order established by the queue for the external memory device.

12. A computing machine embodied in an integrated circuit and in communication with an external memory device, the computing machine comprising:
   a plurality of heterogeneous computational nodes configured to make requests for data transfer to the external memory device; and
   a controller configured to place the requests for data transfer in a queue and allow accesses by the heterogeneous computational nodes to the external memory device in an order established by the queue.

13. The computing machine of claim 12, wherein the controller allows multiple independent simultaneous requests for data transfer by the heterogeneous computational nodes to the external memory device.

14. The computing machine of claim 12, wherein the controller includes a predefined number of channels and is configured to receive requests for data-transfer, the requests assigned to corresponding channels of the predefined number of channels.

15. The computing machine of claim 14, wherein the controller is configured to allow accesses by the heterogeneous computational nodes to the external memory device over the assigned channels.

16. The computing machine of claim 14, wherein the controller is configured to allow requests sent over different channels of the plurality of channels to be processed in an order other than the order in which the requests are received by the controller.

17. The computing machine of claim 12, wherein the controller includes ports that have parameters.

18. The computing machine of claim 17 wherein the controller is configured to generate memory locations for the data transfer requests based on the parameters and is configured to allow accesses by the heterogeneous computing nodes to the external memory device at the memory locations in response to the data transfer requests.

19. The computing machine of claim 18, wherein the parameters are configured by the controller in response to a peek or a poke.

20. The computing machine of claim 12, wherein the controller includes ports that have parameters configured by the controller in response to the requests for data transfer, the controller configured to allow accesses by the heterogeneous computing nodes to the external memory device using the configured parameters of the ports.

21. The computing machine of claim 20, wherein the parameters are configured by the controller in response to a peek or a poke.

22. The computing machine of claim 12 further comprising a programmable interconnection network to provide programmable interconnections among the heterogeneous computational nodes and the controller, the interconnection network routing the data-transfer requests from the heterogeneous computational nodes to the controller, transferring data for the data-transfer requests between the heterogeneous computational nodes and the external memory device via the controller, and transferring data between the heterogeneous computational nodes.

23. An adaptive computing machine comprising:
   a memory;
   a plurality of heterogeneous computational nodes embodied in an integrated circuit and configured to make requests for memory accesses to the memory;
   a programmable interconnection network providing programmable interconnections among the heterogeneous computational nodes; and
   a memory controller including ports that have parameters, the memory controller configured to generate memory locations for the requests based on the parameters and to allow accesses by the heterogeneous computational nodes to the memory at the memory locations in response to the requests and to place the memory requests in a queue and allow accesses by the heterogeneous computational nodes to the memory in an order established by the queue.

24. The adaptive computing machine of claim 23, wherein the memory controller allows multiple independent simultaneous requests for memory accesses by the heterogeneous computational nodes to the memory.

25. The adaptive computing machine of claim 23, wherein the memory controller includes a predefined number of memory channels and is configured to receive requests assigned to corresponding memory channels of the predefined number of memory channels.

26. The adaptive computing machine of claim 25, wherein the memory controller is configured to allow accesses by the heterogeneous computational nodes to the memory over the assigned memory channels.

27. The adaptive computing machine of claim 25, wherein the memory controller is configured to allow requests sent over different channels of the plurality of memory channels to be processed in an order other than the order in which the requests are received by the memory controller.

28. The adaptive computing machine of claim 23, wherein the parameters are configured by the memory controller in response to a peek or a poke.

29. The adaptive computing machine of claim 23, wherein the memory controller is configured to allow accesses by the heterogeneous computational nodes to the memory using the configured parameters of the ports.

30. The adaptive computing machine of claim 29, wherein the parameters are configured by the memory controller in response to a peek or a poke.

31. The adaptive computing machine of claim 23, wherein the interconnection network routes the requests from the heterogeneous computational nodes to the memory controller, routes data for the requests between the heterogeneous computational nodes and the memory via the memory controller, and routes data between the heterogeneous computational nodes.

32. The adaptive computing machine of claim 23, wherein the adaptive computing machine is in communication with an external memory device, and wherein the memory controller is configured to place the memory requests in a queue for the external memory device and allow accesses by the heterogeneous computational nodes to the external memory device in an order established by the queue for the external memory device.

33. An adaptive computing machine embodied in an integrated circuit and in communication with an external memory device, the adaptive computing machine comprising:
a plurality of heterogeneous computational nodes configured to make requests for data transfer to the external memory device;
a programmable interconnection network to provide programmable interconnections among the heterogeneous computational nodes; and
a controller configured to place the requests for data transfer in a queue and allow accesses by the heterogeneous computational nodes to the external memory device in an order established by the queue.

34. The adaptive computing machine of claim 33, wherein the controller allows multiple independent simultaneous requests for data transfer by the heterogeneous computational nodes to the external memory device.

35. The adaptive computing machine of claim 33, wherein the controller includes a predefined number of channels and is configured to receive requests for data-transfer, the requests assigned to corresponding channels of the predefined number of channels.

36. The adaptive computing machine of claim 35, wherein the controller is configured to allow accesses by the heterogeneous computational nodes to the external device with memory over the assigned channels.

37. The adaptive computing machine of claim 35, wherein the controller is configured to allow requests sent over different channels of the plurality of channels to be processed in an order other than the order in which the requests are received by the controller.

38. The adaptive computing machine of claim 33, wherein the controller includes ports that have parameters.

39. The adaptive computing machine of claim 38 wherein the controller is configured to generate memory locations for the data transfer requests based on the parameters and is configured to allow accesses by the heterogeneous computing nodes to the external memory device at the memory locations in response to the data transfer requests.

40. The adaptive computing machine of claim 39, wherein the parameters are configured by the controller in response to a peek or a poke.

41. The adaptive computing machine of claim 33, wherein the controller includes ports that have parameters configured by the controller in response to the requests for data transfer, the controller is configured to allow accesses by the heterogeneous computing nodes to the external memory device using the configured parameters of the ports.

42. The adaptive computing machine of claim 41, wherein the parameters are configured by the controller in response to a peek or a poke.

43. The adaptive computing machine of claim 33, wherein the interconnection network routes the data-transfer requests from the heterogeneous computational nodes to the controller, transfers data for the data-transfer requests between the heterogeneous computational nodes and the external memory device via the controller, and transfers data between the heterogeneous computational nodes.

* * * * *